(12) United States Patent
Ledentsov et al.

(10) Patent No.: US 6,928,099 B2
(45) Date of Patent: Aug. 9, 2005

(54) APPARATUS FOR AND METHOD OF FREQUENCY CONVERSION

(75) Inventors: Nikolai Ledentsov, Berlin (DE); Vitaly Shchukin, Berlin (DE)

(73) Assignee: PBC Lasers Ltd., D.N. Misgav ( * ) Notice: Subject to any disclaimer, the term of this patent is extended or adjusted under 35 U.S.C. 154(b) by 226 days.

(21) Appl. No.: 10/367,824

(22) Filed: Feb. 19, 2003

(65) Prior Publication Data

US 2004/0076213 A1 Apr. 22, 2004

Related U.S. Application Data

(63) Continuation-in-part of application No. PCT/IL02/00718, filed on Aug. 29, 2002.

(51) Int. Cl.[7] .............................. H01S 3/082
(52) U.S. Cl. ...................... 372/97; 372/21; 372/22; 372/96
(58) Field of Search .......................... 372/21, 22, 28, 372/31, 32, 96, 97, 99

(56) References Cited

U.S. PATENT DOCUMENTS

| 5,175,741 A | 12/1992 | Okazaki |
| 5,912,910 A | 6/1999 | Sanders et al. |
| 5,991,317 A | 11/1999 | Nighan, Jr. et al. |
| 6,097,540 A | 8/2000 | Neuberger et al. |
| 6,229,828 B1 | 5/2001 | Sanders et al. |
| 6,241,720 B1 | 6/2001 | Nighan |
| 6,304,585 B1 | 10/2001 | Sanders et al. |

*Primary Examiner*—Min Sun Harvey
*Assistant Examiner*—Delma R. FLores-Ruiz
(74) *Attorney, Agent, or Firm*—G.E. Ehrlich (1995) Ltd.

(57) ABSTRACT

Apparatus for frequency conversion of light, the apparatus comprises: a light-emitting device for emitting a light having a first frequency, the light-emitting device being an edge-emitting semiconductor light-emitting diode having an extended waveguide selected such that a fundamental transverse mode of the extended waveguide is characterized by a low beam divergence. The apparatus further comprises a light-reflector, constructed and designed so that the light passes a plurality of times through an external cavity, defined between the light-emitting device and the light-reflector, and provides a feedback for generating a laser light having the first frequency. The apparatus further comprises a non-linear optical crystal positioned in the external cavity and selected so that when the laser light having the first frequency passes a plurality of times through the non-linear optical crystal, the first frequency is converted to a second frequency being different from the first frequency.

170 Claims, 10 Drawing Sheets

APPARATUS FOR AND METHOD OF FREQUENCY CONVERSION

This is a continuation in part of PCT/IL02/00718, filed Aug. 29, 2002 which claims the benefit of priority from U.S. patent application Ser. No. 09/946,016, filed Sep. 4, 2001, the contents of which are hereby incorporated by reference.

FIELD AND BACKGROUND OF THE INVENTION

The present invention relates to non-linear optics and, more particularly, to an apparatus for frequency conversion of light based on a diode laser structure.

Semiconductor lasers play an important role in optical fiber transmission systems, signal amplification systems, wavelength division multiplexing transmission systems, wavelength division switching systems, wavelength cross-connection systems and the like. In addition semiconductor lasers are useful in the field of optical measurements.

A semiconductor laser (first proposed in 1959) is based on current injection of non-equilibrium carriers into a semiconductor active medium, resulting in population inversion and sufficient modal gain to achieve lasing.

Referring now to the drawings, there are basically two types of semiconductor lasers which presently dominate the laser market, which are depicted in FIGS. 1a–b. FIG. 1a depicts a Vertical Cavity Surface-Emitting Laser (VCSEL), where the photons are cycled in a high finesse cavity in vertical direction (upward in FIG. 1a). In this laser, the cavity is very short and the gain per cycle is very low. Thus, it is of key importance to ensure very low losses at each reflection, otherwise, lasing will either not be possible, or will require too large current densities, not suitable for continuous wave operation. Since first proposed in 1962, VCSELs have become very popular. VCSELs can be made small, may operate at low threshold currents and are produced in a very production-friendly planar technology.

Another type of semiconductor laser is an edge-emitting laser, which is depicted in FIG. 1b. In this laser, an active medium (e.g., a thin layer) is placed in a waveguide having a larger refractive index than the surrounding cladding layers, to ensure a confinement of the laser light in the waveguide. The produced light is diffracted at the facet exit of the device at typically large angles of 30°–60°. The advantage of the edge-emitting laser is its compact output aperture which is realized simultaneously with high light output power. The disadvantage of the edge-emitting laser over the VCSEL is astigmatism phenomenon often occurring when circular output aperture are employed. Additionally, as opposed to the VCSEL, in the edge-emitting laser a temperature increase results in a significant wavelength shift caused by the bandgap narrowing of semiconductors with increasing temperature.

One of shortcomings of all semiconductor lasers is that the wavelengths (or the frequencies) of the emitted light are limited to values provided by the values of the energy bandgap of semiconductor materials. The available wavelengths may additionally be shifted to larger values (the so called red shift), due to localization of carriers by various structures known as quantum well-, quantum wire- or quantum dot heterostructures. The semiconductor laser technology is well developed for III-V compound semiconductors and cover wavelengths beyond 600 nm. Presently known semiconductor lasers below 600 nm (e.g., in the ultraviolet to green spectral range) are much less mature.

An additional disadvantage of the semiconductors lasers is a poor beam quality, wide spectrum and poor temperature stability of the wavelength.

Several methods have been proposed to generate light below 600 nm, basically using non-linear optical techniques which convert the wavelength of the light outputted from the semiconductor laser. These techniques are capable of generation light in an extremely broad spectral range, e.g., from mid-infrared (mid-IR) to visible light. Examples of frequency conversion techniques include sum frequency generation (SFG), frequency doubling (which is a special case of SFG), differential-frequency generation (DFG) and optical parametric generation.

Over the past decade, processes of frequency conversion have become commercial available with the manufacturing of products such as frequency-doubled green sources replacing multi-Watt Ar+ ion lasers and optical parametric oscillators generating mid-IR radiation at enhanced power level for defense applications.

For example, U.S. Pat. No. 5,175,741, the contents of which are hereby incorporated by reference discloses a wavelength conversion method employing a single nonlinear optical (NLO) crystal. A solid-state laser pumped by a semiconductor laser and produces a laser beam which is oscillated by the solid-state laser. The NLO crystal then converts the wavelengths of a laser beam and the wavelength of a pumping laser beam into the wavelength of a wave whose frequency is the sum of the frequencies of the laser beams.

The need of solid-state lasers in frequency conversion processes is generally motivated by several arguments. First, a solid-state laser provides a high quality laser beam with fairly low beam divergence and low astigmatism. Second, the spectral width of the laser beam is sufficiently small to allow a maximum wavelength conversion efficiency of the NLO crystal. For example, for a $KNbO_3$ crystal, the full width at half maximum of the conversion efficiency peak is typically about 0.5 nm. Thus, solid-state lasers with spectral widths below 0.1 nm are well suited for frequency conversion by $KNbO_3$.

However, the above techniques suffer from the following inefficiency limitation. The maximum power conversion efficiency for the light conversion from a semiconductor diode laser to a solid-state laser is not higher than 30%. On the other hand, the frequency conversion efficiency of the solid state laser to the second harmonic using an NLO crystal can be as high as 70%. Thus, the inefficiency of the process is originated in the step of converting the diode laser (or lamp) light to the solid-state laser light.

Proposed techniques for improving efficiency are disclosed, e.g., in U.S. Pat. Nos. 5,991,317 and 6,241,720, the contents of which are hereby incorporated by reference. In these techniques, the concept of an intra-cavity conversion is employed. For example, U.S. Pat. No. 5,991,317 discloses a resonator cavity defined by two or more resonator mirrors. A laser crystal and several NLO crystals are positioned in the resonator cavity. A diode pump source supplies a pump beam to a laser crystal and generates a laser beam with a plurality of axial modes impinging the NLO crystals and producing a frequency doubled (or tripled) output beam.

However, the conversion efficiency of these techniques is still rather low. It is recognized that the low conversion efficiency requires the use of high power diode lasers, which inevitably have to be cooled. Thus, the inefficiency problem is aggravated by the energy loss due to heating which is at least 90% of the total energy.

In addition, the optimal wavelength of the NLO crystal for the conversion efficiency depends on the temperature (for example, for KNbO$_3$ the optimal wavelength is 0.28 nm/°K). This is in contradiction to the solid-state laser in which the wavelength is stable. For an efficient operation, the temperature of the NLO crystal is to be precisely controlled by adding components to the system thereby increasing the complexity of the design.

Another disadvantage is the fact that the solid-state lasers have a strictly defined wavelength, limiting the possibility to get an arbitrary frequency converted wavelength.

In the above technique, the diode laser is used for pumping while the frequency conversion is performed indirectly using the solid-state laser. An alternative solution for improving the efficiency of frequency conversion is to use edge-emitting diode lasers for a direct frequency conversion. However, for such lasers the matching between the laser wavelength and the optimal NLO crystal wavelength is extremely difficult, first because of the broad spectrum of the produced light and second because the lasing wavelength is temperature-dependent.

Another disadvantage is the very high beam divergence of a diode laser. This divergence causes strong deviation of the laser beam with respect to the required crystallographic direction and additionally ruins the performance of the device.

Correction of the beam divergence typically requires a complicated setup involving a few lenses, which are so positioned to focus the pump radiation onto the surface of the NLO crystal [to this end see, e.g., Simon, U. et al., "Difference-Frequency Generation in AgGaS$_2$ by Use of Single-Mode Diode-Laser Pump Sources", *Optics Letters*, 18, No. 13:1062–1064, 1993 and U.S. Pat. Nos. 5,912,910, 6,229,828, and 6,304,585]. However, the additional lenses, which are used for converting the laser output to a parallel beam, are known to cause a significant broadening of the beam diameter hence to reduce the power density, which is a key requirement for efficient wavelength conversion. As a result of these problems, edge-emitting diode lasers are not used commercially for direct frequency conversion and applied mostly as pumping sources for solid state lasers.

Still another system employing semiconductor diode lasers for a direct frequency conversion is disclosed in U.S. Pat. No. 6,097,540. In this system, beams generated by many lasers are combined to a single beam by a system of lenses and mirrors and directed onto a surface of a NLO crystal. However, this solution does not provide a significant advantage over the above techniques, as the proposed system is very complex and expensive, contains a large number of lasers, provides only an extra-cavity conversion and is not wavelength stabilized.

There is thus a widely recognized need for, and it would be highly advantageous to have, an apparatus for frequency conversion devoid of the above limitations.

SUMMARY OF THE INVENTION

According to one aspect of the present invention there is provided an apparatus for frequency conversion of light, the apparatus comprising: (a) a light-emitting device for emitting a light having a first frequency, the light-emitting device being an edge-emitting semiconductor light-emitting diode having an extended waveguide selected such that a fundamental transverse mode of the extended waveguide is characterized by a low beam divergence; (b) a light-reflector, constructed and designed so that the light passes a plurality of times through an external cavity, defined between the light-emitting device and the light-reflector, and provides a feedback for generating a laser light having the first frequency; and (c) a non-linear optical crystal positioned in the external cavity and selected so that when the laser light having the first frequency passes a plurality of times through the non-linear optical crystal, the first frequency is converted to a second frequency being different from the first frequency.

According further features in preferred embodiments of the invention described below, the apparatus further comprises at least one additional light-emitting device.

According to still further features in the described preferred embodiments at least one of the at least one additional light-emitting device is an edge-emitting semiconductor light-emitting diode having the extended waveguide.

According to still further features in the described preferred embodiments the apparatus further comprises a spectrally selective filter positioned so as to prevent light having the second frequency from impinging the light-emitting device.

According to still further features in the described preferred embodiments the apparatus further comprises a lens positioned in the external cavity between the light-emitting device and the non-linear optical crystal.

According to another aspect of the present invention there is provided a method of converting a frequency of light, the method comprising: (a) emitting a light having a first frequency using a light-emitting device, the light-emitting device being an edge-emitting semiconductor light-emitting diode having an extended waveguide selected such that a fundamental transverse mode of the extended waveguide is characterized by a low beam divergence; (b) using a light-reflector for allowing the light to pass a plurality of times within an external cavity, defined between the light-emitting device and the light-reflector, so as to provide a feedback for generating a laser light having the first frequency; and (c) using a non-linear optical crystal positioned in the external cavity to convert the first frequency of the laser light into a second frequency, wherein the second frequency is different from the first frequency.

According to further features in preferred embodiments of the invention described below, the method further comprises emitting the light is by exposing the extended waveguide to an injection current.

According to still further features in the described preferred embodiments the method further comprises transforming a weakly diverging beam of light into a parallel beam of light using a lens.

According to an additional aspect of the present invention there is provided a method of manufacturing an apparatus for frequency conversion of light, the method comprising: (a) providing a light-emitting device for emitting a light having a first frequency, the light-emitting device being an edge-emitting semiconductor light-emitting diode having an extended waveguide selected such that a fundamental transverse mode of the extended waveguide is characterized by a low beam divergence; (b) providing a light-reflector and positioned the light-reflector opposite to the light-emitting device, the light-reflector being constructed and designed so that the light passes a plurality of times through an external cavity, defined between the light-emitting device and the light-reflector, and provides a feedback for generating a laser light having the first frequency; and (c) providing a non-linear optical crystal and positioning the non-linear optical crystal in the external cavity, the non-linear optical crystal being selected so that when the laser light having the first frequency passes a plurality of times through the non-linear optical crystal, the first frequency is converted to a second frequency being different from the first frequency.

According to further features in preferred embodiments of the invention described below, the method further comprises providing at least one additional light-emitting device.

According to still further features in the described preferred embodiments the extended waveguide is capable of emitting light when exposed to an injection current.

According to still further features in the described preferred embodiments a stripe length of the light-emitting device and the injection current are selected so that a non-coherent light is generated solely by the injection current and the laser light is generated by a combination of the injection current and the feedback.

According to still further features in the described preferred embodiments the external cavity is designed such that the laser light is generated substantially in the fundamental transverse mode.

According to still further features in the described preferred embodiments the light-reflector is selected so as to reflect light having a frequency other than the second frequency, and to transmit light having the second frequency.

According to still further features in the described preferred embodiments the light-emitting device is formed from a plurality of layers.

According to still further features in the described preferred embodiments the light-emitting device comprises an n-emitter, adjacent to the extended waveguide from a first side and a p-emitter adjacent to the extended waveguide from a second side.

According to still further features in the described preferred embodiments the extended waveguide comprises an active region formed between a first extended waveguide-region being doped by an n-impurity and a second extended waveguide-region being doped by a p-impurity, the first and the second extended waveguide-region being light transmissive.

According to still further features in the described preferred embodiments the active region comprises at least one layer.

According to still further features in the described preferred embodiments the active region comprises a system selected from the group consisting of a quantum wells system, a quantum wires system, a quantum dots system and any combination thereof.

According to still further features in the described preferred embodiments a thickness of the n-emitter is larger than 10 micrometers.

According to still further features in the described preferred embodiments a front facet of the light-emitting device is coated by an anti-reflecting coat.

According to still further features in the described preferred embodiments a rear facet of the light-emitting device is coated by a highly-reflecting coat.

According to still further features in the described preferred embodiments the highly reflecting coat comprises a plurality of layers.

According to still further features in the described preferred embodiments the highly reflecting coat is characterized by a predetermined stopband being sufficiently narrow so as to provide a high reflectivity of the fundamental transverse mode and a low reflectivity of high-order transverse modes.

According to still further features in the described preferred embodiments the light-reflector comprises a plurality of layers.

According to still further features in the described preferred embodiments the light-reflector is characterized by a predetermined stopband being sufficiently narrow so as to provide a high reflectivity of the fundamental transverse mode and a low reflectivity of high-order transverse modes.

According to still further features in the described preferred embodiments the highly reflecting coat and the light-reflector are each independently characterized by a predetermined stopband being sufficiently narrow so as to provide a high reflectivity of the fundamental transverse mode and a low reflectivity of high-order transverse modes.

According to still further features in the described preferred embodiments the non-linear optical crystal is characterized by a frequency conversion efficiency, and further wherein a temperature dependence of the stopband of the highly reflecting coat equals a temperature dependence of the frequency conversion efficiency.

According to still further features in the described preferred embodiments the non-linear optical crystal is characterized by a frequency conversion efficiency, and further wherein a temperature dependence of the stopband of the light-reflector equals a temperature dependence of the frequency conversion efficiency.

According to still further features in the described preferred embodiments a temperature dependence of the stopband of the highly reflecting coat equals a temperature dependence of the frequency conversion efficiency.

According to still further features in the described preferred embodiments the method further comprises providing a spectrally selective filter and positioning the spectrally selective filter so as to prevent light having the second frequency from impinging the light-emitting device.

According to still further features in the described preferred embodiments the spectrally selective filter is formed on the non-linear optical crystal on a side facing the light-emitting device.

According to still further features in the described preferred embodiments the extended waveguide comprises at least two parts each having a different refractive index such that the extended waveguide is characterized by a variable refractive index.

According to still further features in the described preferred embodiments the at least two parts of the extended waveguide comprise a first part having an intermediate refractive index and a second part having a high refractive index, the first and the second part are designed and constructed such that the fundamental transverse mode is generated in the first part, leaks into the second part and exit through a front facet of the light-emitting device at a predetermined angle.

According to still further features in the described preferred embodiments at least a portion of the extended waveguide comprises a photonic bandgap crystal.

According to still further features in the described preferred embodiments the photonic bandgap crystal comprises a structure having a periodically modulated refractive index, where the structure comprises a plurality of layers.

According to still further features in the described preferred embodiments the light-emitting device comprises at least one absorbing layer capable of absorbing light located within one layer of the photonic bandgap crystal.

According to still further features in the described preferred embodiments the light-emitting device comprises a plurality of absorbing layers such that each one of the plurality of absorbing layer is located within a different layer of the photonic band gap crystal.

According to still further features in the described preferred embodiments at least a portion of the extended waveguide comprises a defect being adjacent to a first side of the photonic bandgap crystal, the defect and the photonic bandgap crystal are selected such that the fundamental transverse mode is localized at the defect and all other modes are extended over the photonic band gap crystal.

According to still further features in the described preferred embodiments the defect comprises an active region having an n-side and a p-side, the active region being capable of emitting light when exposed to an injection current.

According to still further features in the described preferred embodiments a total thickness of the photonic band gap crystal and the defect is selected so as to allow the low beam divergence.

According to still further features in the described preferred embodiments the light-emitting device comprises an n-emitter, adjacent to a second side of the photonic bandgap crystal and a p-emitter being spaced from the photonic bandgap crystal by the defect and adjacent to the defect.

According to still further features in the described preferred embodiments the light-emitting device comprises a p-doped layered structure having a variable refractive index, the p-doped layered structure being between the p-emitter and the defect.

According to still further features in the described preferred embodiments the n-emitter is formed on a first side of a substrate, the substrate being a III-V semiconductor.

According to still further features in the described preferred embodiments the III-V semiconductor is selected from the group consisting of GaAs, InAs, InP and GaSb.

According to still further features in the described preferred embodiments the active region is characterized by an energy bandgap which is narrower than an energy bandgap of the substrate.

According to still further features in the described preferred embodiments the light-emitting device comprises an n-contact being in contact with the substrate and a p-contact being in contact with the p-emitter.

According to still further features in the described preferred embodiments the variable refractive index is selected to prevent extension of the fundamental transverse mode to the n-contact and/or to the p-contact.

According to still further features in the described preferred embodiments the p-emitter comprises at least one p-doped layer being in contact with the extended waveguide and at least one p+-doped layer being in contact with the p-contact.

According to still further features in the described preferred embodiments the defect further comprises a first thin tunnel barrier layer for electrons, located on the n-side of the active region and sandwiched between a first pair of additional layers, and a second thin tunnel barrier layer for holes, located on the p-side of the active region and sandwiched between a second pair of additional layers.

According to still further features in the described preferred embodiments the first thin tunnel barrier layer is formed from a material selected from the group consisting of a weakly-doped n-layer and an undoped layer.

According to still further features in the described preferred embodiments the second thin tunnel barrier layer is formed from a material selected from the group consisting of a weakly-doped p-layer and an undoped layer.

According to still further features in the described preferred embodiments the defect further comprises a thick n-doped layer contiguous with one of the first pair of additional layers remote from the active region; and a thick p-doped layer contiguous with the second pair of additional layers remote from the active region.

According to still further features in the described preferred embodiments at least one of the first pair of additional layers is formed from a material selected from the group consisting of a weakly-doped n-layer and an undoped layer.

According to still further features in the described preferred embodiments at least one of the second pair of additional layers is formed from a material selected from the group consisting of a weakly-doped p-layer and an undoped layer.

According to still further features in the described preferred embodiments the method further comprises providing a lens and positioning the lens in the external cavity between the light-emitting device and the non-linear optical crystal.

According to still further features in the described preferred embodiments the lens is designed and constructed to transform a weakly diverging beam of light into a parallel beam of light.

According to still further features in the described preferred embodiments the light-reflector is a flat light-reflector, capable of reflecting the parallel beam.

The present invention successfully addresses the shortcomings of the presently known concepts and configurations by providing an apparatus for frequency conversion, far exceeding prior art techniques.

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. In case of conflict, the patent specification, including definitions, will control. In addition, the materials, methods, and examples are illustrative only and not intended to be limiting.

BRIEF DESCRIPTION OF THE DRAWINGS

The invention is herein described, by way of example only, with reference to the accompanying drawings. With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

In the drawings.

DESCRIPTION OF THE PREFERRED EMBODIMENTS

The present invention is of an apparatus for and method of frequency conversion which can be used for converting a laser frequency. Specifically, the present invention can be used for providing a laser light having a frequency in a wide spectral range. More specifically, the present invention can be used in, e.g., optical storage applications, where short wavelength is needed to increase the density of the stored information by reducing the characteristic feature size, or in projection displays, where green and blue lasers are needed for full-color applications. The present invention is further of a method of manufacturing the apparatus.

Figure 2:
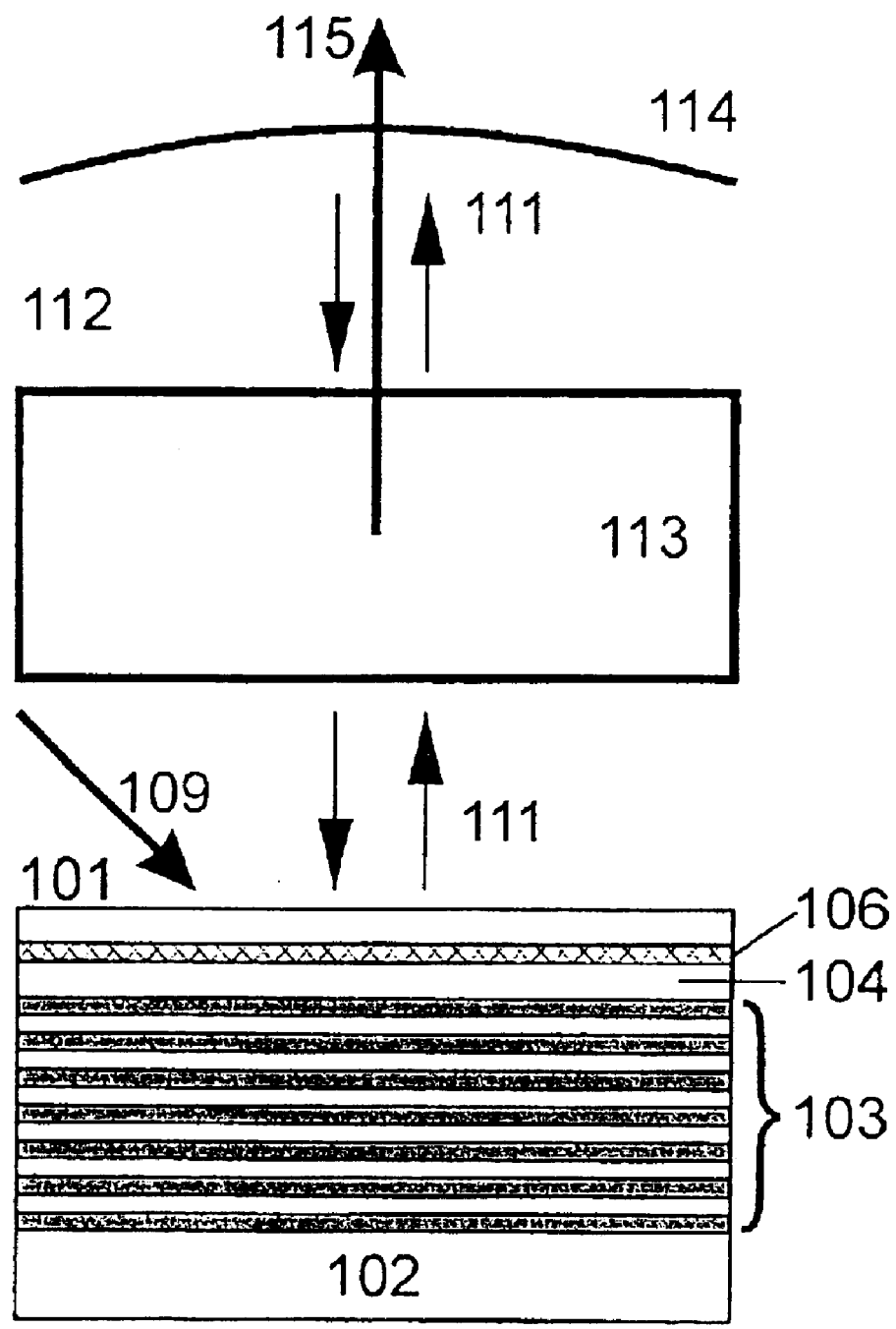
FIG. 2 is a schematic illustration of a prior art frequency conversion apparatus, which is based on a VCSEL.

For purposes of better understanding the present invention, as illustrated in FIGS. 3–8 of the drawings, reference is first made to the construction and operation of a conventional (i.e., prior art) frequency conversion apparatus as illustrated in FIG. 2.

FIG. 2 illustrates a prior art frequency conversion apparatus, which is based on a Vertical Cavity Surface Emitting Laser (VCSEL).

Hence, the prior art apparatus includes a VCSEL-type structure 101 which is manufactured as a multilayered structure, grown epitaxially on a substrate 102. VCSEL-type structure 101 includes a bottom Distributed Bragg Reflector (DBR) 103, and an active region 106 which is located in a semiconductor cavity 104. In this apparatus, VCSEL-type structure 101 does not include a top DBR. Also known in the art are similar apparatuses which include a top DBR with a relatively low quality with respect to DBR 103.

In use, VCSEL-type structure 101 is photo-pumped by an external laser beam 109, and generates a light which is reflected back to VCSEL-type structure 101 by an external mirror 114. VCSEL-type structure 101 and the power of the laser beam 109 are chosen such, that VCSEL-type structure 101 does not generate laser light without an additional power from the light which is reflected from mirror 114. Mirror 114 and VCSEL-type structure 101 define an effective cavity which includes semiconductor cavity 104 and an external cavity 112. The effective cavity confines an enhanced feedback of light, which is sufficient for generating a laser light 111. An NLO crystal 113 located in external cavity 112 is used for converting the frequency of laser light 111 into a laser light 115 with a different frequency (typically higher than the frequency of light 111), which comes out through external mirror 114.

VCSEL structures are known to have a broad aperture of the primary beam, typically, of the order of 100 $\mu$m. The advantage of a broad aperture is that the laser beam divergence is low and there is no difficulty in focusing the light back to the VCSEL aperture without significant losses. The use of external mirror allows realization of accumulation of optical power inside the cavity, as opposed to low-efficiency single-pass amplification in the case of conventional extra-cavity direct diode pumping.

However, as the light output aperture of the VCSEL structure is equal to the surface for heat dissipation, obtaining a high power density from such structures is extremely difficult.

Moreover, the need in photo-excitation of the VCSEL structure dramatically reduces the overall conversion efficiency of the apparatus, which is already restricted by the low power density of the VCSEL. A skilled artisan would appreciate that the VCSEL cannot be uniformly pumped by injection current due to the high resistance of the top contact layer. Therefore, in the above and similar prior art apparatuses the conversion efficiency is compromised by the use of a photo-pumped VCSEL.

Figures 1A, 1B:
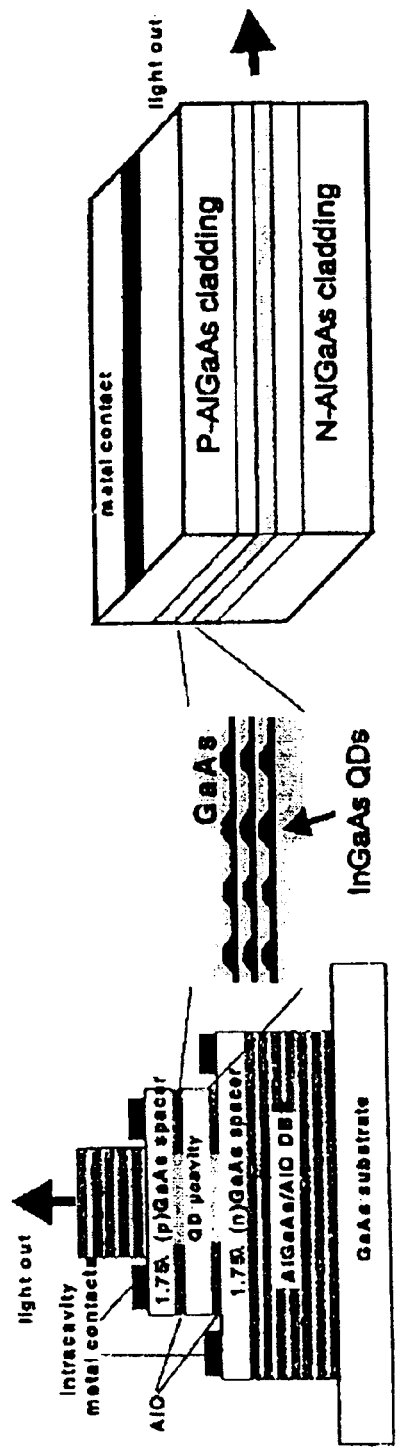
FIG. 1a is a schematic illustration of a prior art Vertical Cavity Surface-Emitting Laser (VCSEL)
FIG. 1b is a schematic illustration of a prior art edge-emitting laser.

One solution to the above limitations is to replace the VCSEL by an edge-emitting semiconductor laser (see FIG. 1b in the Background section above). The advantage of the edge-emitting laser over the VCSEL is twofold: (i) the physical dimensions of the edge-emitting laser are sufficient for efficient heat dissipation, which facilitates a high power density; and (ii) with an edge-emitting laser a direct electric pumping can be used, in contrast to the VCSEL where practically only photo-pumping can be employed.

Presently known edge-emitting lasers, however, have a particularly narrow waveguide, typically in a sub-micrometer range. Due to the narrowness of the waveguide it is difficult to focus the light which is reflected by the mirror back to the waveguide without considerable power losses. In addition, edge-emitting lasers are characterized by a high beam divergence which prevents a precise orientation of the laser light with respect to the optimal crystallographic direction of the NLO crystal.

The present invention successfully provides a solution to the above problems by providing a frequency conversion apparatus having an improved edge-emitting laser, also referred to herein as an edge-emitting semiconductor light-emitting diode.

Thus, according to one aspect of the present invention there is provided an apparatus for frequency conversion of light, generally referred to herein as apparatus 10.

Before explaining at least one embodiment of the invention in detail, it is to be understood that the invention is not limited in its application to the details of construction and the arrangement of the components set forth in the following description or illustrated in the drawings. The invention is capable of other embodiments or of being practiced or carried out in various ways. Also, it is to be understood that the phraseology and terminology employed herein is for the purpose of description and should not be regarded as limiting.

Figure 3:
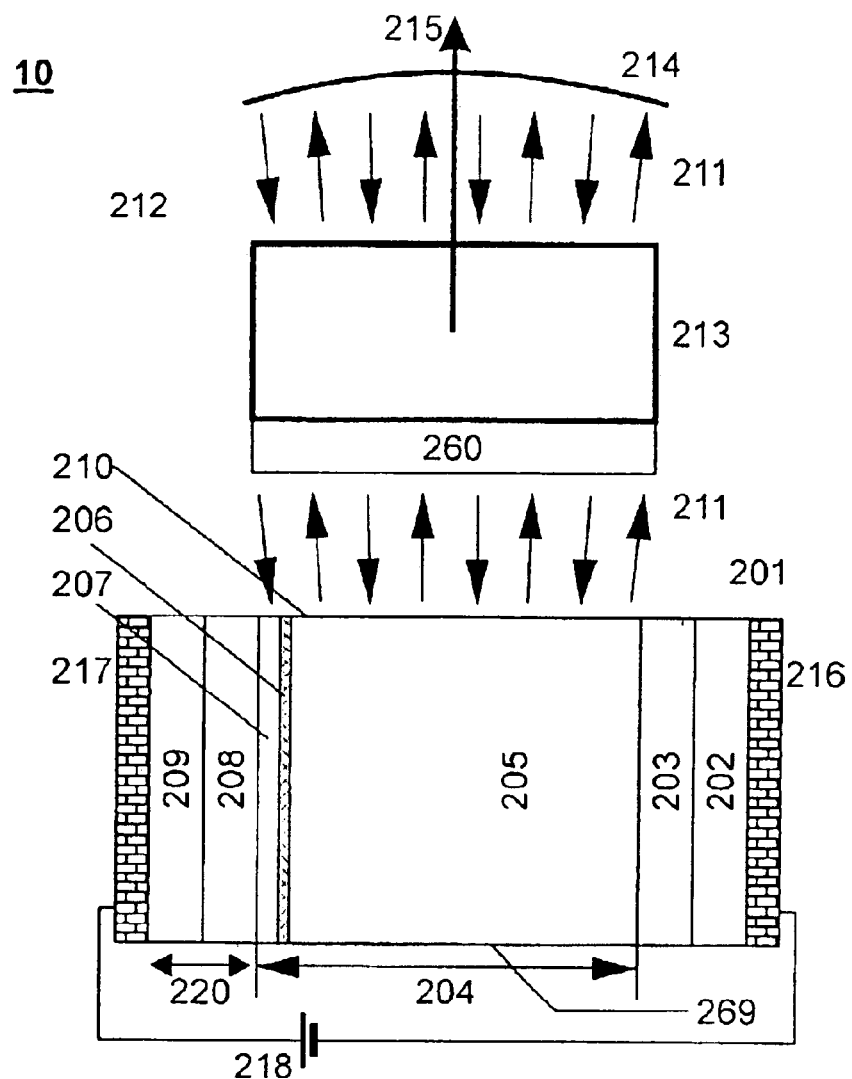
FIG. 3 is a schematic illustration of an apparatus for frequency conversion of light, according to the present invention.

Referring now again to the drawings, FIG. 3 is a schematic illustration of apparatus 10, which comprises a light-emitting device 201 for emitting a light having a first frequency. Light-emitting device 201 is an edge-emitting semiconductor light-emitting diode having an extended waveguide 204 which is selected such that a fundamental transverse mode of waveguide 204 is characterized by a low beam divergence. Apparatus 10 further comprises a light-reflector 214 and an NLO crystal 213 positioned in an external cavity 212 defined between light-emitting device and light-reflector. NLO crystal may be any known NLO crystal characterized by predetermined frequency conversion efficiency, such as, but not limited to, $KNbO_3$ or $LiNbO_3$.

According to a preferred embodiment of the present invention, waveguide 204 is capable of emitting light through a front facet 210 when exposed to an injection current, e.g., using a forward bias 218. Preferably, the stripe length of light-emitting device 201 and the injection current are selected so that the injection current dose not provide the minimal condition for lasing, but rather generates a non-coherent primary light.

External cavity 212 and waveguide 204 form an effective cavity defined between light-reflector 214 and a rear facet 269 of waveguide 204. In operational mode of apparatus 10, this effective cavity provides an additional feedback to the primary emitted light, hence generating a laser light 211.

Figure 8:
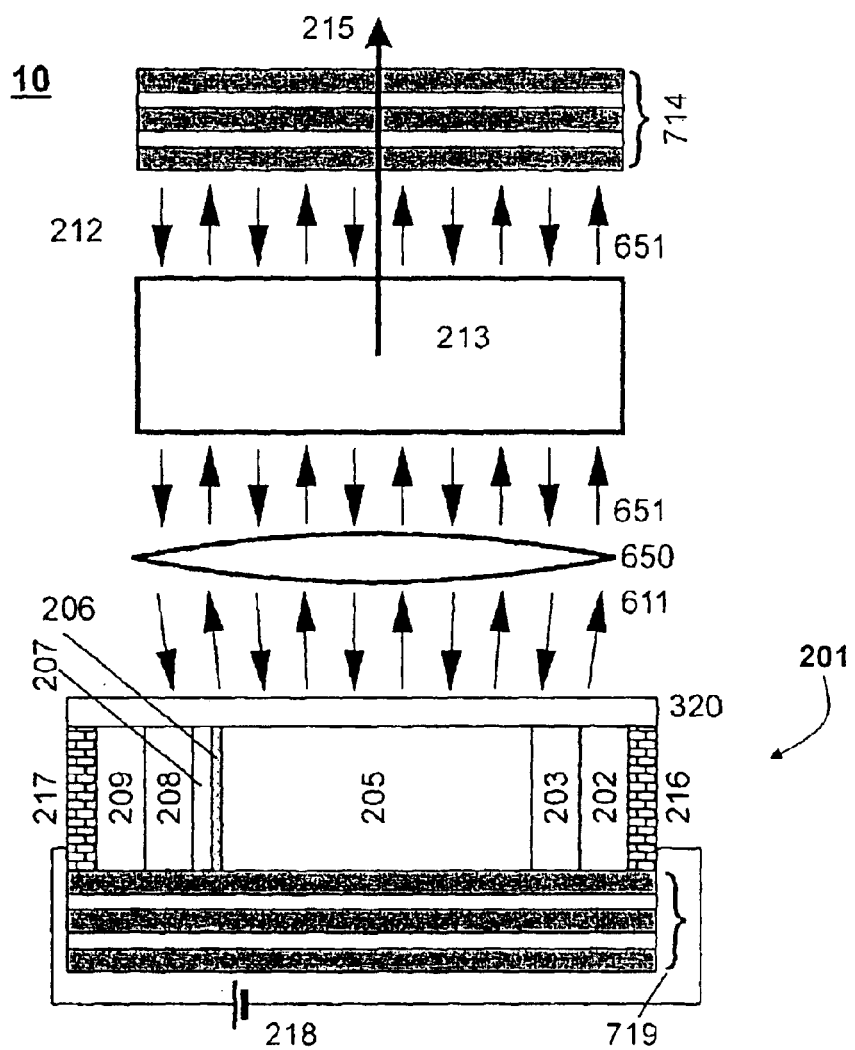
FIG. 8 is a schematic illustration of the apparatus for frequency conversion which comprises additional multilayer coats on the light-emitting device and on the light-reflector, according to the present invention.

According to a preferred embodiment of the present invention a high reflectivity of the fundamental transverse mode of laser light 211 from light-reflector 214 is provided, by a judicious selection of a sufficiently narrow stopband light-reflector 214, formed preferably of a multi-layered structure as further detailed hereinunder, with reference to FIG. 8. One ordinarily skilled in the art would appreciate that a predetermined narrow stopband of light-reflector 214 also serves for filtering out undesired modes of laser light 211 by providing a low reflectivity of high-order transverse modes thereof.

Hence, laser light 211 passes a plurality of times through NLO crystal 213 which converts light 211 into a converted laser light 215 having a second frequency, different from the first frequency. Preferably, light-reflector 214 is selected so as to reflect light having a frequency other than the second frequency (e.g., light 211) and to transmit light having the second frequency (light 215). Additionally, for achieving optimal conversion efficiency of apparatus 10, the stopband of light-reflector 214 preferably has the same (or similar) temperature dependence as the frequency conversion efficiency of NLO 213. Thus, depending on the type, orientation, geometrical shape and dimension of NLO crystal 213 apparatus 10 provides a laser light which can have a substantially low wavelength and, as further explained hereinafter, is of high quality.

Before providing a further detailed description of apparatus 10, as delineated hereinabove and in accordance with the present invention, attention will be given to the advantages offered thereby.

Hence, a particular advantage of the preferred embodiments of the present invention is the design of light-emitting device 201 so that extended waveguide 204 provides a single-mode laser light 211. The use of an extended waveguide typically results in a generation of a plurality of transverse optical modes of the laser light. Then, the fundamental optical mode propagates along the direction of the waveguide and shows a narrow far-field diagram centered at a direction, which is normal to front facet 210 of light-emitting device 201. Propagation of high-order transverse optical modes may be described as occurring at some angle with respect to this direction.

Typically, far field pattern of the high-order modes is significantly broader than that of the fundamental mode, and often contains side lobes. When reflected by light-reflector 214 back to front facet 210, the light in a high-order optical mode is partially diffracted away from the cavity, as opposite to the light of the fundamental mode for which the configuration of light-reflector 214 is optimized. Thus, these diffraction losses are significant for high-order modes and can be done negligibly small for the fundamental mode. In other words, the feedback provided by light-reflector 214 is strong for the fundamental mode and weak for the high-order modes. This allows fulfilling the conditions on the injection current, the length of the laser stripe, the shape and the position of the external mirror such, that lasing occurs only in the fundamental transverse mode.

One of ordinarily skilled in the art would appreciate that the above is a general advantage which is irrespective of the number of light-emitting devices which are employed. More specifically, according to a preferred embodiment of the present invention more than one light-emitting device may be used, where the light generated by the additional light-emitting devices can be directed via a special optical system, onto NLO crystal 213. Then, a sum frequency generation or a differential-frequency generation or any other combination of frequencies is possible, provided that at least one of the light-emitting devices is manufactured and operates similarly to light-emitting device 201.

According to a preferred embodiment of the present invention light-emitting device 201 is grown on a substrate 202, preferably formed from any III-V semiconductor material or III-V semiconductor alloy, e.g., InAs, InP, GaSb, or others. More preferably substrate 202 is made of GaAs.

A particular feature of apparatus 10 is extended waveguide 204 which, as stated, provides a light in which the fundamental transverse mode has a low beam divergence. According to a preferred embodiment of the present invention waveguide 204 is formed between an n-emitter 203 and a p-emitter 220, where n-emitter 203 is preferably grown directly on substrate 202 and being adjacent to waveguide 204 from one side, while p-emitter is adjacent to waveguide 204 from the other side.

Extended waveguide 204 preferably comprises an active region 206 formed between a first waveguide-region 205 being doped by an n-impurity and a second waveguide-region 207 being doped by a p-impurity. Both first 205 and second 207 regions are light transmissive.

First 205 and second 207 regions are preferably layers, or multi-layered structures formed of materials which are either lattice-matched or nearly lattice-matched to substrate 202.

Impurities which may be introduced into first waveguide-region 205 are donor impurities, such as, but not limited to, S, Se and Te. Alternatively first waveguide-region 205 may be doped by amphoteric impurities such as, but not limited to, Si, Ge and Sn, which may be introduced under such technological conditions that they are incorporated predominantly into the cation sub-lattice hence serve as donor impurities. Hence, first waveguide-region 205 may be, for example, GaAs or GaAlAs layers grown by molecular beam epitaxy and doped by Si impurities with a concentration of about $2 \times 10^{17}$ cm$^{-3}$.

As used herein the term "about" refers to ±50%.

Impurities which may be introduced into second waveguide-region 207 are acceptor impurities, such as, but not limited to, Be, Mg, Zn, Cd, Pb and Mn. Alternatively, second waveguide-region 207 may be doped by amphoteric impurities such as, but not limited to, Si, Ge and Sn, which may be introduced under such technological conditions that they are incorporated predominantly into the anion sublattice and serve as acceptor impurities. Hence, second waveguide-region 207 may be, for example, GaAs or GaAlAs layers grown by molecular beam epitaxy and doped by Be impurities with a concentration of about $2 \times 10^{17}$ cm$^{-3}$.

Active region 206 is preferably formed by any insertion having an energy band gap which is narrower than the energy gap of substrate 202. According to a preferred embodiment of the present invention active regions 206 may be, for example, a system of quantum wells, quantum wires, quantum dots, or any combination thereof. Active region 206 may be formed either as a single-layer system or a multi-layer system. In the preferred embodiment in which substrate 202 is made of GaAs, active region 206 may be, for example, a system of insertions of InAs, In$_{1-x}$Ga$_x$As, In$_x$Ga$_{1-x-y}$Al$_y$As, In$_x$Ga$_{1-x}$As$_{1-y}$N$_y$, or similar materials, where x and y label an alloy compositions.

N-emitter 203 is preferably made of a material which is either lattice-matched or nearly lattice-matched to substrate 202, for example, the alloy material Ga$_{1-x}$Al$_x$As. In addition n-emitter 203 is preferably transparent to the generated light and doped by donor impurities, similarly to the doping of first waveguide-region 205 as further detailed hereinabove.

According to a preferred embodiment of the present invention p-emitter 220 comprises at least one p-doped layer 208 and at least one p+-doped layer 209, where p-doped layer 208 is positioned between waveguide 204 and p+-doped layer 209. Both p-doped layer 208 and p+-doped layer 209 are preferably light-transmissive, and are formed of a material, which is either lattice-matched or nearly lattice-matched to substrate 202. Layers 208 and 209 are doped with acceptor impurities, similarly to the doping of second waveguide-region 207. The difference between layer 209 and layer 208 is in the doping level. Preferably, whereas the levels of doping of second waveguide-region 207 and of p-doped layer 208 are similar, the doping level of p+-doped layer 209 is higher. For example, in the embodiment in which the doping level of second waveguide-region 207 is about $2 \times 10^{17}$ cm$^{-3}$, p+-doped layer 209 may be a GaAlAs layer grown by molecular beam epitaxy and doped by Be impurity with a concentration of about $2 \times 10^{19}$ cm$^{-3}$.

A preferred thickness of device 201 is 10 $\mu$m or more, the preferred stripe width is from about 7 $\mu$m to about 10 $\mu$m or more, and a preferred length of device 201 is about 100 $\mu$m or more.

As stated, light-emitting device 201 is designed and constructed so that waveguide 204 provides a single-mode laser light 211. This can be achieved, for example, by selecting the refractive index of n-emitter 203 and of p-doped layer 208 to be lower than the refractive index of waveguide 204. Such configuration ensures that the fundamental transverse mode of the laser radiation is confined within waveguide 204 and decays in n-emitter 203 and p-doped layer 208.

Forward bias 218 is preferably connected to light-emitting device 201 via an n-contact 216, being in contact with substrate 202, and a p-contact 217, being in contact with p-emitter 220 (or p+-doped layer 209). Contacts 216 and 217 may be realized using any known structures, such as, but not limited to, multi-layered metal structures. For example, n-contact 216 may be formed as a three-layered structure of Ni—Au—Ge, and p-contact 217 may be formed as a three-layered structure of Ti—Pt—Au.

According to a preferred embodiment of the present invention apparatus 10 further comprises a spectrally selective filter 260 positioned so as to prevent light 215 from impinging light-emitting device 201. In one embodiment, filter 260 may be formed on NLO crystal 213, opposite to light-emitting device 201. In this embodiment, filter 260 may be formed of, e.g., a dielectric deposit such as, but not limited to, SiO$_2$, MgF$_2$, or ZnS.

Figure 4:
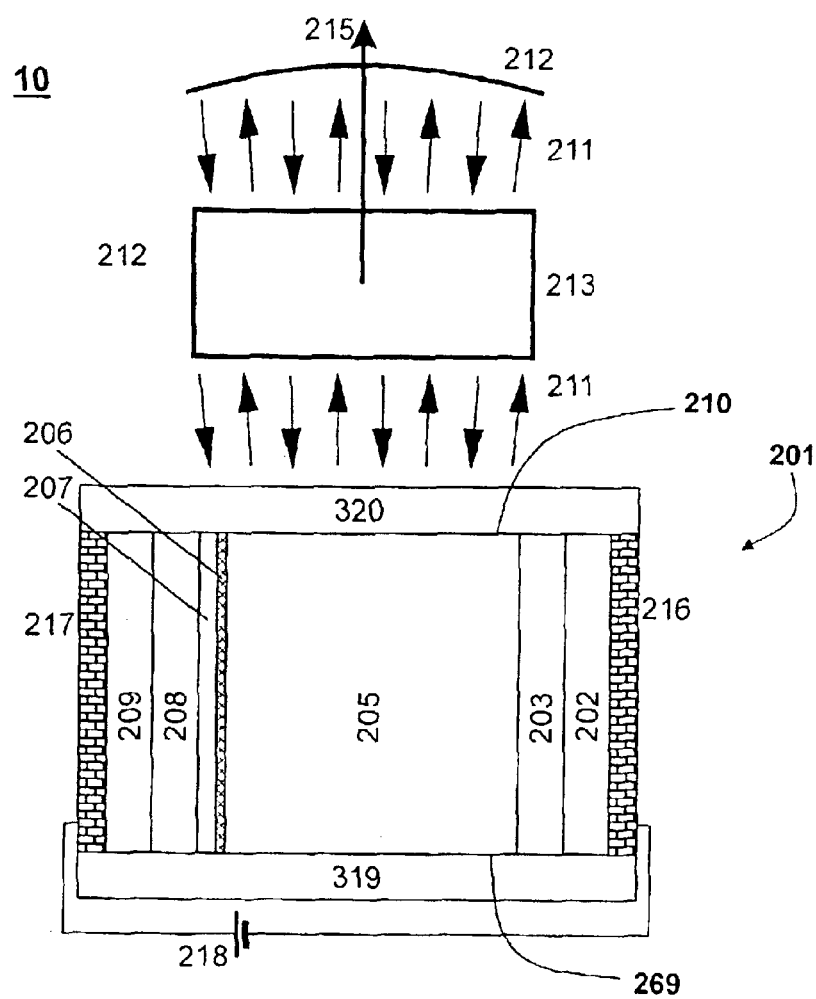
FIG. 4 is a schematic illustration of the apparatus for frequency conversion which comprises an anti-reflecting coat and a highly-reflecting coat, formed on different facets of a light-emitting device, according to the present invention.

With reference to FIG. 4, according to a preferred embodiment of the present invention front facet 210 and rear facet 269 of light-emitting device 201 are coated by an anti-reflecting coat 320 and a highly-reflecting coat 319 respectively.

Highly-reflecting coat 319 serves for minimizing the losses through rear facet 269. This can be done, e.g., by forming a coat having a stopband in reflectivity. The stopband of coat 319 can be designed to be sufficiently narrow so as to provide a high reflectivity of the fundamental transverse mode and a low reflectivity of high-order transverse modes. According to a preferred embodiment of the present invention coat 319 is formed of a multi-layered dielectric structure, designed to provide a high reflectivity in a narrow spectral region. As further detailed hereinunder (see FIG. 8) in this embodiment the reflectivity is higher and losses are lower for the fundamental transverse optical mode, while for high-order modes the losses will be significantly higher. Hence, this embodiment allows an additional selection of modes and facilitates achieving single-mode lasing.

Anti-reflecting coat 320 ensures that lasing occurs only with the additional feedback, and only for the fundamental transverse optical mode, as further detailed hereinabove.

According to a preferred embodiment of the present invention, the stopbands of coats 319 and 320 have the same (or similar) temperature dependence as the frequency conversion efficiency of NLO 213. Each of coatings 319 and 320 preferably comprises a plurality of layers, formed from any suitable material known in the art, e.g., dielectric deposits such as, but not limited to, SiO$_2$, MgF$_2$, or ZnS.

Figure 5:
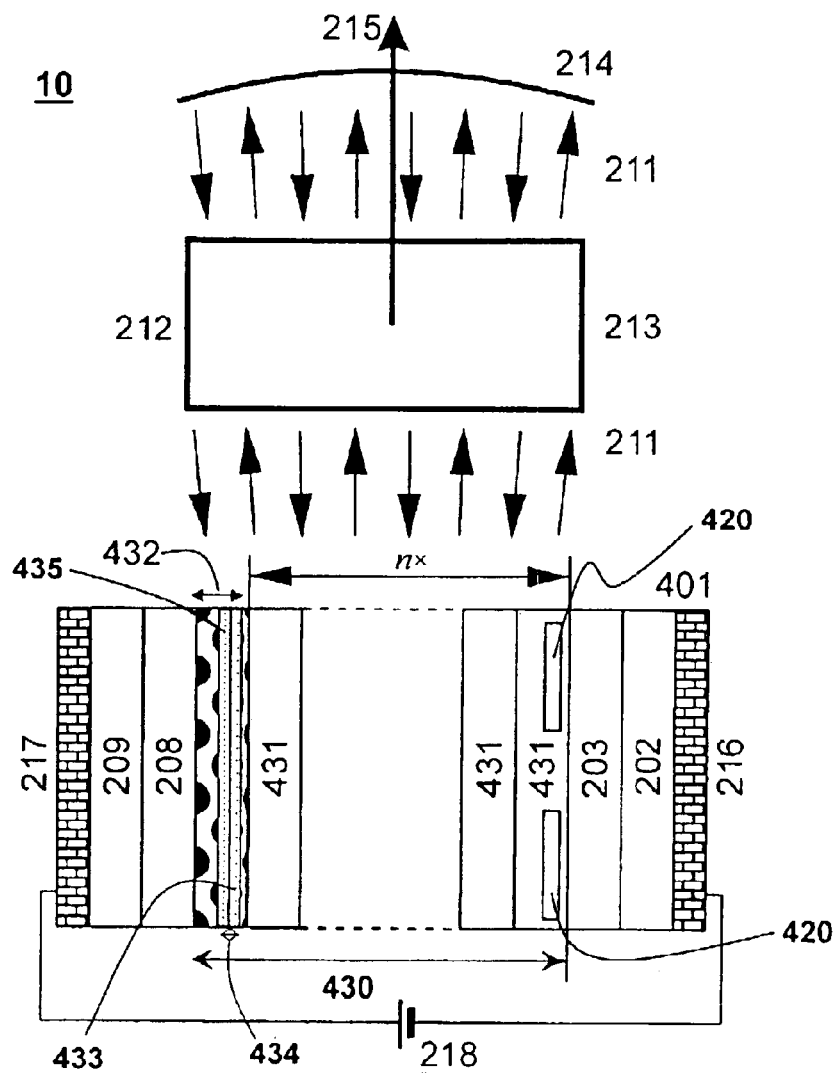
FIG. 5 is a schematic illustration of the apparatus for frequency conversion in which the light-emitting device comprises a photonic bandgap crystal, according to the present invention.

Reference is now made to FIG. 5, which is a schematic illustration of apparatus 10 in a preferred embodiment in which the concept of photonic bandgap crystal laser is employed. To better identify the presently preferred embodiment of the invention, which is further detailed hereinbelow, the light-emitting device and the waveguide are designated in FIG. 5 by numerals 401 and 440, respectively.

Hence, in this embodiment, at least a portion of extended waveguide 440 comprises n periods 431 of a photonic bandgap crystal (PBC) 430. Each period 431 of PBC 430 is preferably formed from two n-doped layers one of low refractive index and one of high refractive index.

According to a preferred embodiment of the present invention light-emitting device 401 comprises a defect 432 positioned between PBC 430 and p-doped layer 208. Defect 432 preferably comprises an active region 434 having an n-side 433 and a p-side 435, for emitting light when exposed to the injection current, e.g., using bias 218. As further explained hereinbelow, the use of PBC 430 for primary generation of light provides a high-efficiency low threshold current density source of radiation with a very broad waveguide.

The concept of PBC lasers was first introduced in an article by Ledentsov, N. N. and Shchukin, V. A., entitled "Long Wavelength Lasers Using GaAs-Based Quantum Dots", published in *Photonics and Quantum Technologies for Aerospace Applications IV, Proceedings of SPIE*, Donkor, E. et al., editors, 4732:15–26, 2002. Broadly speaking, a PBC is a multi-dimensional structure characterized by periodic refractive index modulation. Consider, for simplicity, a structure with a periodic modulation of the refractive index in only one, say z-direction. In an infinite, perfectly periodic PBC, the electromagnetic waves, or photons, are characterized by a well defined wave vector, $k_x$ in the x-direction and $k_y$ in the y-direction, such that the spatial dependence of every component of the electric field, E, or magnetic field, H, on x and y spatial coordinates is described as a plane wave, $$E, H \sim \exp(ik_x x)\exp(ik_y y), \quad (EQ. 1)$$

whereas the dependence on the z-coordinate is described, according Bloch's theorem, not as a plane wave but rather as a product of a plane wave and a periodic function, u(z), having the same period as the modulation of the refraction index. Thus, the total spatial dependence of the fields is:

$$E, H \sim \exp(ik_x x)\exp(ik_y y)\exp(ik_z z)u(z). \quad (EQ. 2)$$

The characteristic bands of the frequency of electromagnetic waves, or of the photon energy comprise allowed bands, for which periodic electromagnetic waves propagate throughout the crystal, and forbidden bandgaps, for which no propagation of an electromagnetic wave is possible.

A perfect periodicity of the PBC can be deliberately broken by either a termination of a sequence of layers (insertions) or by any type of a defect which violates the periodical profile of the refractive index. Such a defect can either localize or delocalize the electromagnetic waves. In the case of a localizing defect, two types of electromagnetic waves are possible: (i) waves localized at the defect and decaying away from the defect and (ii) waves which extend over the entire PBC, where the spatial profile of the extended waves may be perturbed by a defect.

In a more traditional type of a laser based on a periodic sequence of layers the light propagates in the direction parallel to the refractive index modulation axis, say z, whereas the x- and y-components of the wave vector satisfy $k_x=0$, and $k_y=0$. This situation is typical for a VCSEL. In this type of laser periodic sequences of layers are designed to provide high reflectivity spectral range (stopband) at some critical wavelength. The "defect" layer is designed to provide a confined mode within this stopband.

A strong advantage of the PBC laser as proposed by Ledenstov et al. is that this laser benefits from PBC properties, which are not related to reflection of particular wavelength. In this approach, the PBC is designed such that the periodic modulation of the refractive index occurs in the z-direction, whereas the main propagation of the light occurs in the x-direction. The periodicity is broken such that the light in the transverse fundamental mode is localized in the z-direction at the defect and decays away from the defect in the z-direction. In this case no general requirements for particular spectral position of the stopband in reflectivity or the external cavity thickness for the given wavelength exists. As the periodicity of the PBC is not directly related to the wavelength of propagating light, apparatus 10 may be used simultaneously for a wide range of wavelengths, e.g., 1 μm, 0.9 μm and 0.8 μm. One would appreciate that this property of apparatus 10 provides extremely high tolerances both in design and in manufacturing, which tolerances are particularly advantageous for direct frequency conversion.

The ability of defect 432 to localize modes of laser radiation is governed by two parameters. The first parameter is the difference between the refractive indices of defect 432 and the reference layer of the PBC, Δn. The second parameter is the volume of the defect. For a one-dimensional PBC, in which the refractive index is modulated in one direction only, the second parameter is the thickness of defect 432. Generally, as the value of Δn increases, at a fixed defect thickness, the number of modes being localized by the defect also increases. As the thickness of the defect increases, at a fixed Δn, the number of modes being localized by the defect also increases. These two parameters, Δn and the thickness of the defect, may be chosen so that one and only one mode of laser radiation is localized by defect 432. The other modes are extended over the PBC.

Hence, according to a preferred embodiment of the present invention defect 432 and PBC 430 are selected such, that the fundamental optical mode, which propagates in the direction perpendicular to the refractive index modulation axis, is localized at defect 432 and decays away from defect 432, whereas all other (high-order) optical modes are extended over the entire photonic band gap crystal. The gain region can then be placed directly at the defect of the photonic band gap crystal or close to it.

The desired refractive index profile throughout the entire structure is calculated as follows. A model structure is introduced. The fundamental TE-mode and the high-order TE modes are obtained from the solution of the eigenvector problem for the wave equation. As the fundamental mode is calculated, the far field pattern is calculated by using the method, given, e.g., in H. C. Casey, Jr. and M. B. Panish, Semiconductor Lasers, Part A, Academic Press, N.Y., 1978, Chapter 2. The desired structure is obtained as a result of the optimization providing the preferred interplay between the lowest beam divergence, the maximum amplitude of the fundamental mode in the active region, and the lowest ratio of the amplitudes of the higher modes at the active region to that of the fundamental mode.

As stated, active region 434 is preferably placed in defect 432 where the fundamental mode of laser radiation is localized. The required localization length of the fundamental mode is determined by the interplay of two tendencies. On the one hand, the localization length needs to be large enough to provide a low far-field beam divergence. On the other hand, the localization length should be sufficiently shorter than the length of the PBC. This provides efficient localization of the fundamental mode on the scale of the total thickness of the PBC and therefore a significant enhancement of the electric field strength in the fundamental mode compared to that of the other modes. For example, in one embodiment the PBC laser achieves a beam divergence of 4° while the confinement factor is 0.11 of that in a standard double heterostructure laser having a 0.8 μm GaAs cavity and $Ga_{1-x}Al_xAs$ cladding layers, where x=0.3.

It would be appreciated that this design promotes a single transverse mode lasing from extended waveguide 440 resulting in an efficient frequency conversion of light by apparatus 10.

According to a preferred embodiment of the present invention the materials from which contact layers 216 and 217 are made are selected so that only the extended high-order modes are scattered by layers 216 and 217 whereas the fundamental mode being well localized by defect 432, does not reach the contact region hence is not scattered. Appropriate materials for contact layers 216 and 217 include, e.g., alloyed metals.

In addition, light-emitting device 401 may further comprise one or more absorbing layers 420 located within one of the first layers 431 of PBC 430, away from defect 432 such that all extended high-order modes are absorbed, while the localized fundamental mode remains unaffected. Absorbing layers 420 may also be located such within different layers 431 of the PBC 430.

The PBC is preferably formed from a material lattice-matched or nearly lattice-matched to substrate 202 and transparent to the emitted light. In the above example of a device on a GaAs-substrate, the preferred embodiment is the alloy $Ga_{1-x}Al_xAs$ with a modulated aluminum composition, x. The number of periods, n, the thickness of each layer, and the alloy composition in each layer are preferably chosen to provide the localization of one and only one mode of laser radiation.

The number of layers in light-emitting device 401 and the location of the active region may vary, depending on the manufacturing process of apparatus 10 and on the application for which apparatus 10 is designed. Hence, one embodiment includes structures where the absorbing layers are introduced similar to the embodiment of FIG. 5, but the active region is located outside the defect. Another embodiment includes structures where the active region is located outside the defect and graded index layers are introduced between each layer with a low refractive index and a neighboring layer having a high refractive index. An additional embodiment, in which the active region is located outside the defect, includes thin tunnel barriers for carriers which surround the active region. Other embodiments of the present invention are possible where the active region is located outside the defect and some or all elements e.g., the absorbing layers, the graded-index layers and the thin tunnel barriers for carriers surrounding are included. Other embodiments of the present invention include structures where the defect is located either on the n-side or on the p-side from active region.

A preferred thickness of device 401 is about 10 µm or more, the preferred number of periods 431 of PBC 430 is from about 5 to about 10 or more, the preferred stripe width is from about 7 µm to about 10 µm and more and the preferred length of device 401 is about 100 µm or more.

The efficiency of apparatus 10 may be further enhanced by an appropriate leakage design of light-emitting device 401, in which all the extended high-order modes are leaky and penetrate into substrate 202 or contact layers 216 and 217, as opposed to the fundamental mode, which, as stated, does not reach substrate 202 or contact layers 216 and 217 and does not suffer from any leaky loss.

Figure 6:
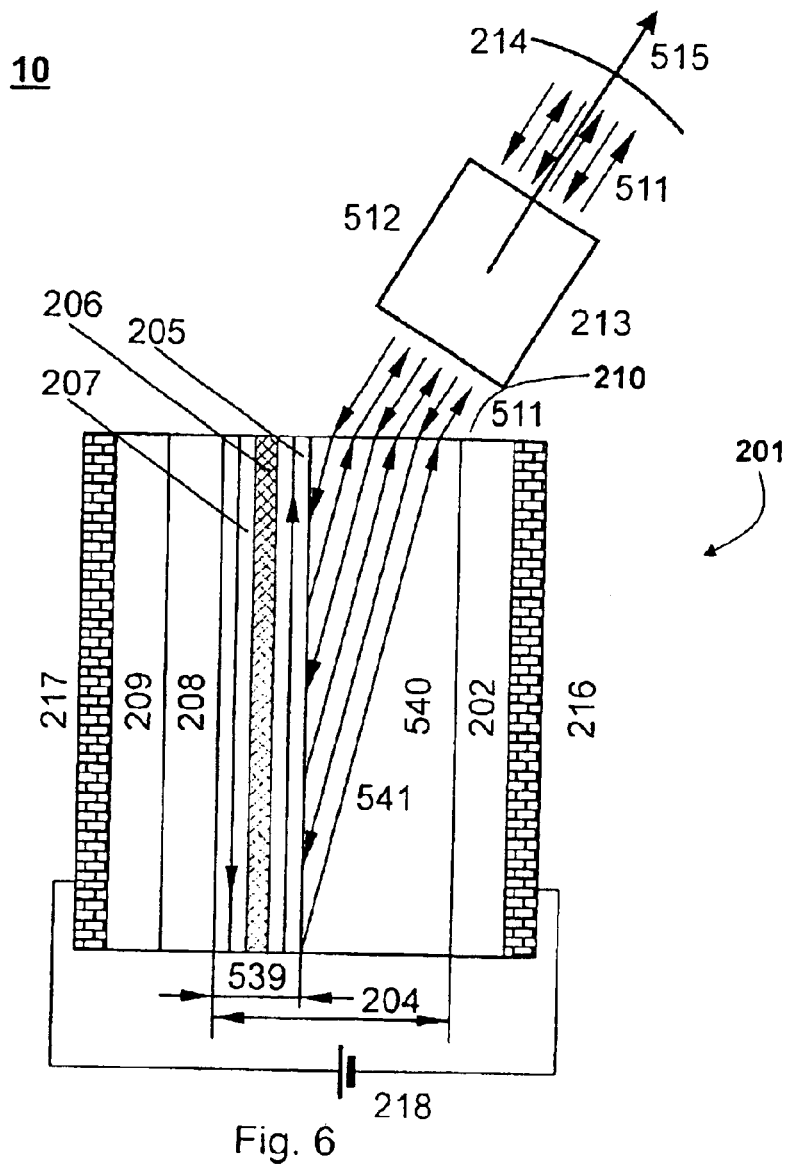
FIG. 6 is a schematic illustration of the apparatus for frequency conversion in which a leaky laser is used for generating the primary light, according to the present invention.

Reference is now made to FIG. 6, which illustrates apparatus 10 in a preferred embodiment in which a leaky laser is used for generating the primary light.

Hence, in this embodiment, waveguide 204 preferably comprises two parts, a first part 539 having an intermediate refractive index and preferably a second part 540 having a high refractive index. Active region 206 is sandwiched between layers 205 and 207 each of which is characterized by an intermediate refractive index. The light which is generated in active region 206 leaks out the first part 539 (with the intermediate refractive index) to the second part 540 (with the higher refractive index), propagates therethrough along a path 541, and exit through front facet 210 propagating along path 511 within external cavity 512. Light 511 propagates in the cavity, generally in a direction tilted with respect to the normal to front facet 210. Propagation at a certain angle results in a feedback which selectively exists only for a single transverse leaky mode. Being a single mode light, once light 511 enters NLO crystal 213, an efficiently frequency conversion occurs, and a converted light 515 is generated. Light 515 comes out through the light-reflector 214 as further detailed hereinabove.

Second part 540, into which the leaking of the fundamental mode occurs, is preferably formed of a material, lattice-matched or nearly lattice-matched to substrate 202, transparent to the emitted light, n-doped, and having a high refractive index. The type of the doping impurity and the doping level are preferably the same as for layer 203 as further detailed hereinabove. For in the example of a device on a GaAs substrate, the preferred material is $Ga_{1-x}Al_xAs$, where the modulated aluminum composition, x is chosen upon requirements on the refractive index.

Optionally and preferably, the leaky laser for generating the primary light may be manufactured such that waveguide 204 comprises only first part 539 (without second part 540. In this embodiment, the generated light leaks directly into substrate 202.

Figure 7:
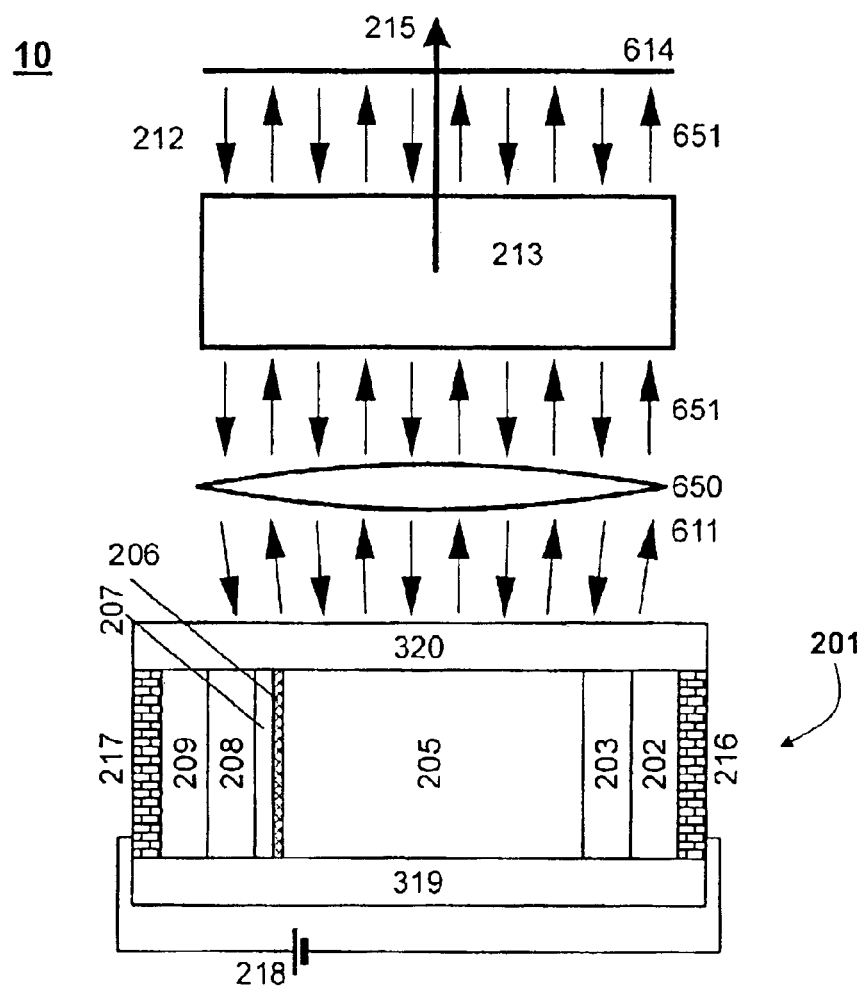
FIG. 7 is a schematic illustration of the apparatus for frequency conversion which comprises a lens for providing a parallel beam and a flat light-reflector, according to the present invention.

With reference to FIG. 7, according to a preferred embodiment of the present invention apparatus 10 may further comprise a lens 650 for convert a weakly divergent beam 611 into a parallel beam 651. In this embodiment, a flat light-reflector 614 is used instead of a focusing light-reflector. A particular advantage of this embodiment is that the design of a flat light-reflector requires is generally simpler than the design of a focusing light-reflector. Lens 650 can be made of any appropriate material known in the art, such as, but not limited to, glass or quartz glass.

FIG. 8 illustrates apparatus 10 in another preferred embodiment which includes several coats. Hence, as already explained hereinabove, light-emitting device 201 may comprise, anti-reflecting coat 320 on front facet 210, and highly-reflecting coat 719 which may be formed of a multi-layered dielectric structure, on rear facet 269. In this embodiment, an additional highly-reflecting coat 714 is used as a light-reflector. Alternatively, coat 714 may be formed on light-reflectors 214 or 614. The thickness, shape and number of layers of coat 714 are preferably designed to facilitate selective reflection, absorption and/or transmission properties of coat 714. Specifically, coat 714 preferably provides high reflectivity and low losses of the fundamental transverse mode (211, 511 or 651), high transmission coefficient and low losses for the converted light 215 and high losses for high-order undesired modes.

It is to be understood that the scope of the present invention is intended to include all combinations of the above coats. For example, in some embodiments one or more coats may independently be realized as a single layer or a multilayer coat. Additionally, in other embodiments coat 714 may be included together with coat 320 and/or coat 319.

The use of multilayered structures for the coats allows to choose such constituent materials, that the spectral position of the narrow stopband(s) shift upon temperature variations in the same way as the spectral position of the maximum efficiency of the optical frequency conversion of the NLO crystal. This allows achieving an extremely high temperature stability of the frequency conversion efficiency of apparatus 10.

Coats 714 and 719 may be formed of any suitable material known to have specific reflection, absorption and/or transmission properties, such as but are not limited to, alternating dielectric deposits of materials, e.g., $SiO_2$, $MgF_2$, or ZnS.

Figure 9:
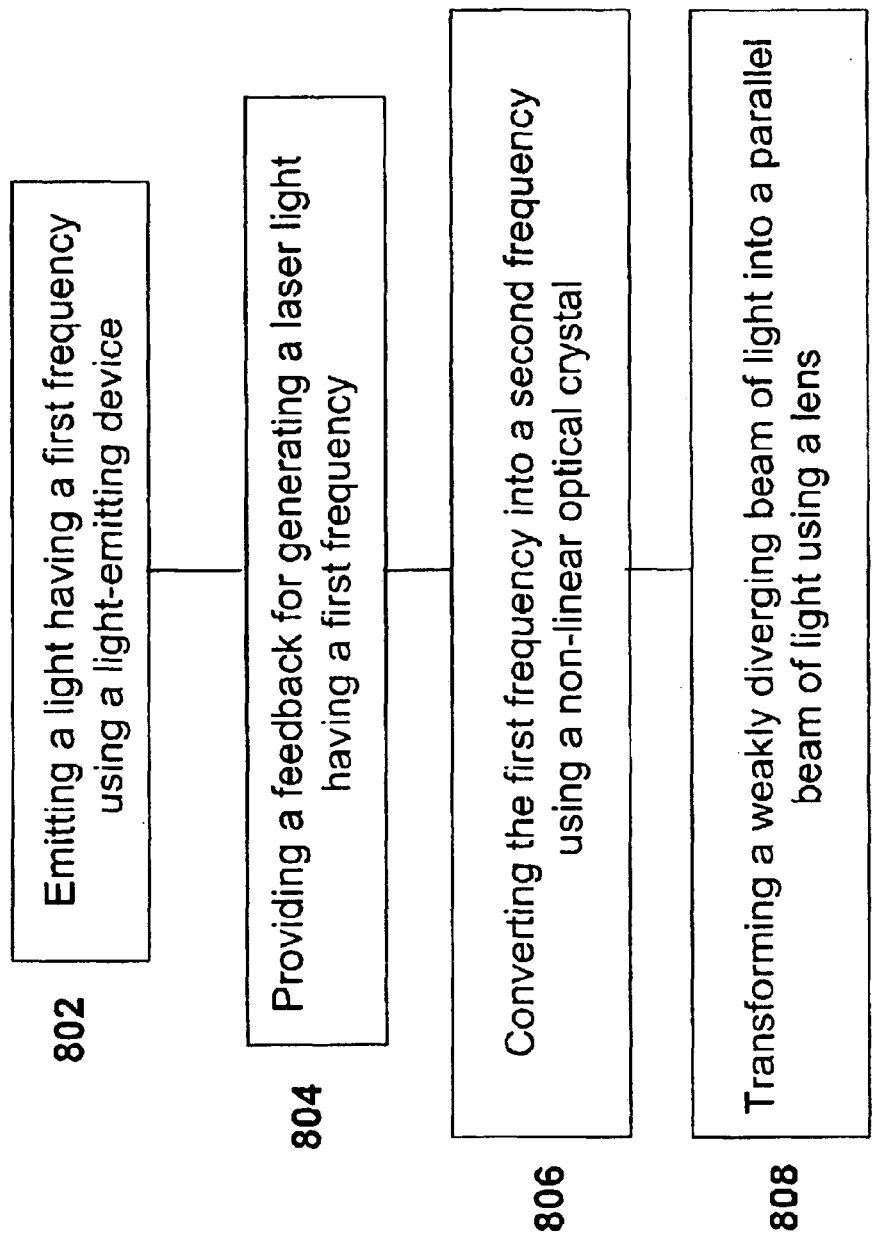
FIG. 9 is a flowchart of a method of converting a frequency of light, according to the present invention.

Referring now to FIG. 9, according to another aspect of the invention there is provided a method of converting a frequency of light. The method comprising the following method steps which are illustrated in the flowchart of FIG. 9.

Hence, in a first step, designated by Block 802, a light having a first frequency is emitted from a light-emitting device, which may be, for example, light-emitting device 201 or light-emitting device 401, as further detailed hereinabove. In a second step, designated by Block 804 a light-reflector is used for allowing the light to pass a plurality of times within an external cavity and through a NLO crystal, where the external cavity may be designed, e.g., as external cavity 212 or external cavity 512 and the NLO crystal may be any known NLO crystal having suitable light conversion properties, e.g., NLO crystal 213 with or without coat 260 as further detailed hereinabove. By passing the light a plurality of times within the external cavity a feedback is provided which is sufficient for generating a laser light having a first frequency. In a third step, designated by Block 806, the laser light having the first frequency passes a plurality of times through the non-linear optical crystal. The non-linear optical crystal converts the first frequency of the laser light into a second frequency, different from first frequency.

According to a preferred embodiment of the present invention the light-reflector may be any one of light-reflectors 214, 614, 714 or similar thereto. Additionally and preferably, the light reflector may be coated be a single-layer coat or a multi layer coat as further detailed hereinabove. Optionally, the method may further comprise an additional step, designated by Block 808, in which a weakly diverging beam of light is transformed into a parallel beam of light using a lens, e.g., lens 650.

According to an additional aspect of the invention there is provided a method of manufacturing an apparatus for frequency conversion of light.

Figure 10:
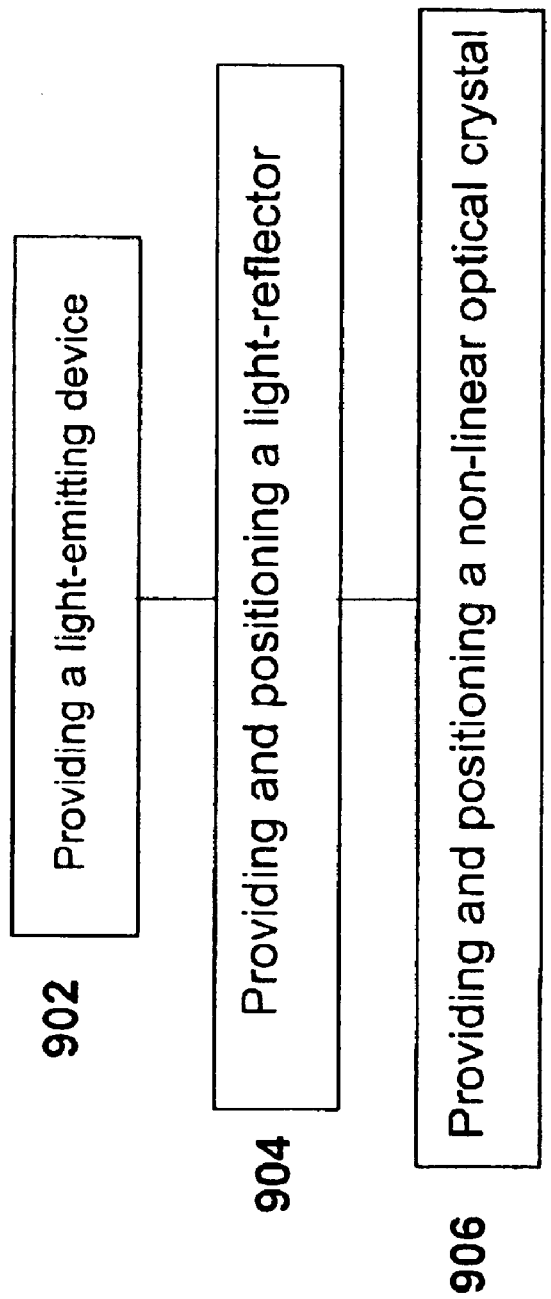
FIG. 10 is a flowchart of a method of manufacturing the apparatus for frequency conversion, according to the present invention.

FIG. 10 is a flowchart of the method steps of the method, in which in a first step, designated by Block 902, a light-emitting device, e.g., light-emitting device 201 or light-emitting device 401, is provided. In a second step, designated by Block 904, a light-reflector is provided and positioned opposite to the light-emitting device, and in a third step, designated by block 906, an NLO crystal is provided and positioned in an external cavity defined between the light-emitting device and the light-reflector. According to a preferred embodiment of the present invention the light-emitting device, the light-reflector and the non-linear optical crystal are constructed and designed so that light passes a plurality of times through the NLO crystal and provides a feedback for generating a laser light having converted frequency, as further detailed hereinabove.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims. All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention.

What is claimed is:

1. An apparatus for frequency conversion of light, the apparatus comprising:
(a) a light-emitting device for emitting a light having a first frequency, said light-emitting device being an edge-emitting semiconductor light-emitting diode having an extended waveguide selected such that a fundamental transverse mode of said extended waveguide is characterized by a low beam divergence;
(b) a light-reflector, constructed and designed so that said light passes a plurality of times through an external cavity, defined between said light-emitting device and said light-reflector, and provides a feedback for generating a laser light having said first frequency; and
(c) a non-linear optical crystal positioned in said external cavity and selected so that when said laser light having said first frequency passes a plurality of times through said non-linear optical crystal, said first frequency is converted to a second frequency being different from said first frequency.

2. The apparatus of claim 1, further comprising at least one additional light-emitting device.

3. The apparatus of claim 2, wherein at least one of said at least one additional light-emitting device is an edge-emitting semiconductor light-emitting diode having said extended waveguide.

4. The apparatus of claim 1, wherein said extended waveguide is capable of emitting light when exposed to an injection current.

5. The apparatus of claim 4, wherein a stripe length of said light-emitting device and said injection current are selected so that a non-coherent light is generated solely by said injection current and said laser light having said first frequency is generated by a combination of said injection current and said feedback.

6. The apparatus of claim 1, wherein said external cavity is designed such that said laser light having said first frequency is generated substantially in said fundamental transverse mode.

7. The apparatus of claim 1, wherein said light-reflector is selected so as to reflect light having a frequency other than said second frequency, and to transmit light having said second frequency.

8. The apparatus of claim 1, wherein said light-emitting device is formed from a plurality of layers.

9. The apparatus of claim 1, wherein said light-emitting device comprises an n-emitter, adjacent to said extended waveguide from a first side and a p-emitter adjacent to said extended waveguide from a second side.

10. The apparatus of claim 9, wherein said n-emitter is formed on a first side of a substrate, said substrate being a III-V semiconductor.

11. The apparatus of claim 10, wherein said III-V semiconductor is selected from the group consisting of GaAs, InAs, InP and GaSb.

12. The apparatus of claim 10, wherein said light-emitting device comprises an n-contact being in contact with said substrate and a p-contact being in contact with said p-emitter.

13. The apparatus of claim 12, wherein said p-emitter comprises at least one p-doped layer being in contact with said extended waveguide and at least one p+-doped layer being in contact with said p-contact.

14. The apparatus of claim 10, wherein said extended waveguide comprises an active region formed between a first extended waveguide-region being doped by an n-impurity and a second extended waveguide-region being doped by a p-impurity, said first and said second extended waveguide-region being light transmissive.

15. The apparatus of claim 14, wherein said active region is characterized by an energy bandgap which is narrower than an energy bandgap of said substrate.

16. The apparatus of claim 14, wherein said active region comprises at least one layer.

17. The apparatus of claim 14, wherein said active region comprises a system selected from the group consisting of a quantum wells system, a quantum wires system, a quantum dots system, and any combination thereof.

18. The apparatus of claim 9, wherein a thickness of said n-emitter is larger than 10 micrometers.

19. The apparatus of claim 1, wherein a front facet of said light-emitting device is coated by an anti-reflecting coat.

20. The apparatus of claim 1, wherein a rear facet of said light-emitting device is coated by a highly-reflecting coat.

21. The apparatus of claim 19, wherein a rear facet of said light-emitting device is coated by a highly-reflecting coat.

22. The apparatus of claim 20, wherein said highly reflecting coat comprises a plurality of layers.

23. The apparatus of claim 20, wherein said highly reflecting coat is characterized by a predetermined stopband being sufficiently narrow so as to provide a high reflectivity of said fundamental transverse mode and a low reflectivity of high-order transverse modes.

24. The apparatus of claim 1, wherein said light-reflector comprises a plurality of layers.

25. The apparatus of claim 24, wherein said light-reflector is characterized by a predetermined stopband being sufficiently narrow so as to provide a high reflectivity of said fundamental transverse mode and a low reflectivity of high-order transverse modes.

26. The apparatus of claim 20, wherein said highly reflecting coat and said light-reflector are each independently characterized by a predetermined stopband being sufficiently narrow so as to provide a high reflectivity of said fundamental transverse mode and a low reflectivity of high-order transverse modes.

27. The apparatus of claim 23, wherein said non-linear optical crystal is characterized by a frequency conversion efficiency, and further wherein a temperature dependence of said stopband of said highly reflecting coat equals a temperature dependence of said frequency conversion efficiency.

28. The apparatus of claim 25, wherein said non-linear optical crystal is characterized by a frequency conversion efficiency, and further wherein a temperature dependence of said stopband of said light-reflector equals a temperature dependence of said frequency conversion efficiency.

29. The apparatus of claim 26, wherein a temperature dependence of said stopband of said highly reflecting coat equals a temperature dependence of said frequency conversion efficiency.

30. The apparatus of claim 29, wherein a temperature dependence of said stopband of said light-reflector equals a temperature dependence of said frequency conversion efficiency.

31. The apparatus of claim 1, further comprising a spectrally selective filter positioned so as to prevent light having said second frequency from impinging said light-emitting device.

32. The apparatus of claim 31, wherein said spectrally selective filter is formed on said non-linear optical crystal on a side facing said light-emitting device.

33. The apparatus of claim 1, wherein said extended waveguide comprises at least two parts each having a different refractive index such that said extended waveguide is characterized by a variable refractive index.

34. The apparatus of claim 33, wherein said at least two parts of said extended waveguide comprise a first part having an intermediate refractive index and a second part having a high refractive index, said first and said second part are designed and constructed such that said fundamental transverse mode is generated in said first part, leaks into said second part and exit through a front facet of said light-emitting device at a predetermined angle.

35. The apparatus of claim 1, wherein at least a portion of said extended waveguide comprises a photonic bandgap crystal.

36. The apparatus of claim 35, wherein said photonic bandgap crystal comprises a structure having a periodically modulated refractive index, said structure comprises a plurality of layers.

37. The apparatus of claim 36, wherein said light-emitting device comprises at least one absorbing layer capable of absorbing light located within one layer of said photonic bandgap crystal.

38. The apparatus of claim 36, wherein said light-emitting device comprises a plurality of absorbing layers such that each one of said plurality of absorbing layer is located within a different layer of said photonic band gap crystal.

39. The apparatus of claim 35, at least a portion of said extended waveguide comprises a defect being adjacent to a first side of said photonic bandgap crystal, said defect and said photonic bandgap crystal are selected such that said fundamental transverse mode is localized at said defect and all other modes are extended over said photonic band gap crystal.

40. The apparatus of claim 39, wherein said defect comprises an active region having an n-side and a p-side, said active region being capable of emitting light when exposed to an injection current.

41. The apparatus of claim 39, wherein a total thickness of said photonic band gap crystal and said defect is selected so as to allow said low beam divergence.

42. The apparatus of claim 41, wherein said light-emitting device comprises an n-emitter, adjacent to a second side of said photonic bandgap crystal and a p-emitter being spaced from said photonic bandgap crystal by said defect and adjacent to said defect.

43. The apparatus of claim 42, wherein said light-emitting device comprises a p-doped layered structure having a variable refractive index, said p-doped layered structure being between said p-emitter and said defect.

44. The apparatus of claim 42, wherein said n-emitter is formed on a first side of a substrate, said substrate being a III-V semiconductor.

45. The apparatus of claim 44, wherein said III-V semiconductor is selected from the group consisting of GaAs, InAs, InP and GaSb.

46. The apparatus of claim 44, wherein said light-emitting device comprises an n-contact being in contact with said substrate and a p-contact being in contact with said p-emitter.

47. The apparatus of claim 46, wherein said light-emitting device comprises a p-doped layered structure having a variable refractive index, said p-doped layered structure being between said p-emitter and said defect.

48. The apparatus of claim 47, wherein said variable refractive index is selected to prevent extension of said fundamental transverse mode to said n-contact and/or said p-contact.

49. The apparatus of claim 46, wherein said p-emitter comprises at least one p-doped layer being in contact with said extended waveguide and at least one p+-doped layer being in contact with said p-contact.

50. The apparatus of claim 40, wherein said defect further comprises a first thin tunnel barrier layer for electrons, located on said n-side and sandwiched between a first pair of additional layers, and a second thin tunnel barrier layer for holes, located on said p-side and sandwiched between a second pair of additional layers.

51. The apparatus of claim 50, wherein said first thin tunnel barrier layer is formed from a material selected from the group consisting of a weakly-doped n-layer and an undoped layer.

52. The apparatus of claim 50, wherein said second thin tunnel barrier layer is formed from a material selected from the group consisting of a weakly-doped player and an undoped layer.

53. The apparatus of claim 50, wherein said defect further comprises a thick n-doped layer contiguous with one of said first pair of additional layers remote from said active region; and a thick p-doped layer contiguous with said second pair of additional layers remote from said active region.

54. The apparatus of claim 50, wherein at least one of said first pair of additional layers is formed from a material selected from the group consisting of a weakly-doped n-layer and an undoped layer.

55. The apparatus of claim 50, wherein at least one of said second pair of additional layers is formed from a material selected from the group consisting of a weakly-doped p-layer and an undoped layer.

56. The apparatus of claim 1, further comprising a lens positioned in said external cavity between said light-emitting device and said non-linear optical crystal.

57. The apparatus of claim 56, wherein said lens is designed and constructed to transform a weakly diverging beam of light into a parallel beam of light.

58. The apparatus of claim 57, wherein said light-reflector is a flat light-reflector, capable of reflecting said parallel beam.

59. A method of converting a frequency of light, the method comprising:
   (a) emitting a light having a first frequency using a light-emitting device, said light-emitting device being an edge-emitting semiconductor light-emitting diode having an extended waveguide selected such that a fundamental transverse mode of said extended waveguide is characterized by a low beam divergence;
   (b) using a light-reflector for allowing said light to pass a plurality of times within an external cavity, defined between said light-emitting device and said light-reflector, so as to provide a feedback for generating a laser light having said first frequency; and
   (c) using a non-linear optical crystal positioned in said external cavity to convert said first frequency into a second frequency, thereby providing a laser light having said second frequency, wherein said second frequency is different from said first frequency.

60. The method of claim 59, wherein said emitting said light is by exposing said extended waveguide to an injection current.

61. The method of claim 60, wherein a stripe length of said light-emitting device and said injection current are selected so that a non-coherent light is generated solely by said injection current and said laser light having said first frequency is generated by a combination of said injection current and said feedback.

62. The method of claim 59, wherein said external cavity is designed such that said laser light having said first frequency is generated substantially in said fundamental transverse mode.

63. The method of claim 59, wherein said light-reflector is selected so as to reflect light having a frequency other than said second frequency, and to transmit light having said second frequency.

64. The method of claim 59, wherein said light-emitting device is formed from a plurality of layers.

65. The method of claim 59, wherein said light-emitting device comprises an n-emitter, adjacent to said extended waveguide from a first side and a p-emitter adjacent to said extended waveguide from a second side.

66. The method of claim 65, wherein said n-emitter is formed on a first side of a substrate, said substrate being a III-V semiconductor.

67. The method of claim 66, wherein said III-V semiconductor is selected from the group consisting of GaAs, InAs, InP and GaSb.

68. The method of claim 66, wherein said light-emitting device comprises an n-contact being in contact with said substrate and a p-contact being in contact with said p-emitter.

69. The method of claim 68, wherein said p-emitter comprises at least one p-doped layer being in contact with said extended waveguide and at least one p+-doped layer being in contact with said p-contact.

70. The method of claim 66, wherein said extended waveguide comprises an active region formed between a first extended waveguide-region being doped by an n-impurity and a second extended waveguide-region being doped by a p-impurity, said first and said second extended waveguide-region being light transmissive.

71. The method of claim 70, wherein said active region is characterized by an energy bandgap which is narrower than an energy bandgap of said substrate.

72. The method of claim 70, wherein said active region comprises at least one layer.

73. The method of claim 70, wherein said active region comprises a system selected from the group consisting of a quantum wells system, a quantum wires system, a quantum dots system, and any combination thereof.

74. The method of claim 65, wherein a thickness of said n-emitter is larger than 10 micrometers.

75. The method of claim 59, wherein a front facet of said light-emitting device is coated by an anti-reflecting coat.

76. The method of claim 59, wherein a rear facet of said light-emitting device is coated by a highly-reflecting coat.

77. The method of claim 75, wherein a rear facet of said light-emitting device is coated by a highly-reflecting coat.

78. The method of claim 76, wherein said highly-reflecting coat comprises a plurality of layers.

79. The method of claim 76, wherein said highly-reflecting coat is characterized by a predetermined stopband being sufficiently narrow so as to provide a high reflectivity of said fundamental transverse mode and a low reflectivity of high-order transverse modes.

80. The method of claim 59, wherein said light-reflector comprises a plurality of layers.

81. The method of claim 80, wherein said light-reflector is characterized by a predetermined stopband being sufficiently narrow so as to provide a high reflectivity of said fundamental transverse mode and a low reflectivity of high-order transverse modes.

82. The method of claim 76, wherein said highly-reflecting coat and said light-reflector are each independently characterized by a predetermined stopband being sufficiently narrow so as to provide a high reflectivity of said fundamental transverse mode and a low reflectivity of high-order transverse modes.

83. The method of claim 79, wherein said non-linear optical crystal is characterized by a frequency conversion efficiency, and further wherein a temperature dependence of said stopband of said highly reflecting coat equals a temperature dependence of said frequency conversion efficiency.

84. The method of claim 81, wherein said non-linear optical crystal is characterized by a frequency conversion efficiency, and further wherein a temperature dependence of said stopband of said light-reflector equals a temperature dependence of said frequency conversion efficiency.

85. The method of claim 82, wherein a temperature dependence of said stopband of said highly reflecting coat equals a temperature dependence of said frequency conversion efficiency.

86. The method of claim 85, wherein a temperature dependence of said stopband of said light-reflector equals a temperature dependence of said frequency conversion efficiency.

87. The method of claim 59, further comprising a spectrally selective filter positioned so as to prevent light having said second frequency from impinging said light-emitting device.

88. The method of claim 87, wherein said spectrally selective filter is formed on said non-linear optical crystal on a side facing to said light-emitting device.

89. The method of claim 59, wherein said extended waveguide comprises at least two parts each having a different refractive index such that said extended waveguide is characterized by a variable refractive index.

90. The method of claim 89, wherein said at least two parts of said extended waveguide comprise a first part having an intermediate refractive index and a second part having a high refractive index, said first and said second part are designed and constructed such that said fundamental transverse mode is generated in said first part, leaks into said second part and exit through a front facet of said light-emitting device at a predetermined angle.

91. The method of claim 59, wherein at least a portion of said extended waveguide comprises a photonic bandgap crystal.

92. The method of claim 91, wherein said photonic bandgap crystal comprises a structure having a periodically modulated refractive index, said structure comprises a plurality of layers.

93. The method of claim 92, wherein said light-emitting device comprises at least one absorbing layer capable of absorbing light located within one layer of said photonic bandgap crystal.

94. The method of claim 92, wherein said light-emitting device comprises a plurality of absorbing layers such that each one of said plurality of absorbing layer is located within a different layer of said photonic band gap crystal.

95. The method of claim 91, wherein at least a portion of said extended waveguide comprises a defect being adjacent to a first side of said photonic bandgap crystal, said defect and said photonic bandgap crystal are selected such that said fundamental transverse mode is localized at said defect and all other modes are extended over said photonic band gap crystal.

96. The method of claim 95, wherein said defect comprises an active region having an n-side and a p-side, said active region being capable of emitting light when exposed to an injection current.

97. The method of claim 95, wherein a total thickness of said photonic band gap crystal and said defect is selected so as to allow said low beam divergence.

98. The method of claim 95, wherein said light-emitting device comprises an n-emitter, adjacent to a second side of said photonic bandgap crystal and a p-emitter being spaced from said photonic bandgap crystal by said defect and adjacent to said defect.

99. The method of claim 98, wherein said light-emitting device comprises a p-doped layered structure having a variable refractive index, said p-doped layered structure being between said p-emitter and said defect.

100. The method of claim 98, wherein said n-emitter is formed on a first side of a substrate, said substrate being a III-V semiconductor.

101. The method of claim 100, wherein said III-V semiconductor is selected from the group consisting of GaAs, InAs, InP and GaSb.

102. The method of claim 100, wherein said light-emitting device comprises an n-contact being in contact with said substrate and a p-contact being in contact with said p-emitter.

103. The method of claim 102, wherein said light-emitting device comprises a p-doped layered structure having a variable refractive index, said p-doped layered structure being between said p-emitter and said defect.

104. The method of claim 103, wherein said variable refractive index is selected to prevent extension of said fundamental transverse mode to said n-contact and/or said p-contact.

105. The method of claim 102, wherein said p-emitter comprises at least one p-doped layer being in contact with said extended waveguide and at least one p+-doped layer being in contact with said p-contact.

106. The method of claim 96, wherein said defect further comprises a first thin tunnel barrier layer for electrons, located on said n-side and sandwiched between a first pair of additional layers, and a second thin tunnel barrier layer for holes, located on said p-side and sandwiched between a second pair of additional layers.

107. The method of claim 106, wherein said first thin tunnel barrier layer is formed from a material selected from the group consisting of a weakly-doped n-layer and an undoped layer.

108. The method of claim 106, wherein said second thin tunnel barrier layer is formed from a material selected from the group consisting of a weakly-doped p-layer and an undoped layer.

109. The method of claim 106, wherein said defect further comprises a thick n-doped layer contiguous with one of said first pair of additional layers remote from said active region; and a thick p-doped layer contiguous with said second pair of additional layers remote from said active region.

110. The method of claim 106, wherein at least one of said first pair of additional layers is formed from a material selected from the group consisting of a weakly-doped n-layer and an undoped layer.

111. The method of claim 106, wherein at least one of said second pair of additional layers is formed from a material selected from the group consisting of a weakly-doped p-layer and an undoped layer.

112. The method of claim 59, further comprising transforming a weakly diverging beam of light into a parallel beam of light using a lens.

113. The method of claim 112, wherein said light-reflector is a flat light-reflector, capable of reflecting said parallel beam.

114. A method of manufacturing an apparatus for frequency conversion of light, the method comprising:

(a) providing a light-emitting device for emitting a light having a first frequency, said light-emitting device being an edge-emitting semiconductor light-emitting diode having an extended waveguide selected such that a fundamental transverse mode of said extended waveguide is characterized by a low beam divergence;

(b) providing a light-reflector and positioned said light-reflector opposite to said light-emitting device, said light-reflector being constructed and designed so that said light passes a plurality of times through an external cavity, defined between said light-emitting device and said light-reflector, and provides a feedback for generating a laser light having said first frequency; and (c) providing a non-linear optical crystal and positioning said non-linear optical crystal in said external cavity, said non-linear optical crystal being selected so that when said laser light having said first frequency having said first frequency passes a plurality of times through said non-linear optical crystal, said first frequency is converted to a second frequency being different from said first frequency.

115. The method of claim 114, further comprising providing at least one additional light-emitting device.

116. The method of claim 114, wherein said extended waveguide is capable of emitting light when exposed to an injection current.

117. The method of claim 116, wherein a stripe length of said light-emitting device and said injection current are selected so that a non-coherent light is generated solely by said injection current and said laser light having said first frequency is generated by a combination of said injection current and said feedback.

118. The method of claim 114, wherein said external cavity is designed such that said laser light having said first frequency is generated substantially in said fundamental transverse mode.

119. The method of claim 114, wherein said light-reflector is selected so as to reflect light having a frequency other than said second frequency, and to transmit light having said second frequency.

120. The method of claim 114, wherein said light-emitting device is formed from a plurality of layers.

121. The method of claim 114, wherein said light-emitting device comprises an n-emitter, adjacent to said extended waveguide from a first side and a p-emitter adjacent to said extended waveguide from a second side.

122. The method of claim 121, wherein said n-emitter is formed on a first side of a substrate, said substrate being a III-V semiconductor.

123. The method of claim 122, wherein said III-V semiconductor is selected from the group consisting of GaAs, InAs, InP and GaSb.

124. The method of claim 122, wherein said light-emitting device comprises an n-contact being in contact with said substrate and a p-contact being in contact with said p-emitter.

125. The method of claim 124, wherein said p-emitter comprises at least one p-doped layer being in contact with said extended waveguide and at least one p+-doped layer being in contact with said p-contact.

126. The method of claim 122, wherein said extended waveguide comprises an active region formed between a first extended waveguide-region being doped by an n-impurity and a second extended waveguide-region being doped by a p-impurity, said first and said second extended waveguide-region being light transmissive.

127. The method of claim 126, wherein said active region is characterized by an energy bandgap which is narrower than an energy bandgap of said substrate.

128. The method of claim 126, wherein said active region comprises at least one layer.

129. The method of claim 126, wherein said active region comprises a system selected from the group consisting of a quantum wells system, a quantum wires system, a quantum dots system, and any combination thereof.

130. The method of claim 121, wherein a thickness of said n-emitter is larger than 10 micrometers.

131. The method of claim 114, further comprising coating a front facet of said light-emitting device by an anti-reflecting coat.

132. The method of claim 114, further comprising coating a rear facet of said light-emitting device by a highly-reflecting coat.

133. The method of claim 131, further comprising coating a rear facet of said light-emitting device by a highly-reflecting coat.

134. The method of claim 132, wherein said highly reflecting coat comprises a plurality of layers.

135. The method of claim 132, wherein said highly reflecting coat is characterized by a predetermined stopband being sufficiently narrow so as to provide a high reflectivity of said fundamental transverse mode and a low reflectivity of high-order transverse modes.

136. The method of claim 114, wherein said light-reflector comprises a plurality of layers.

137. The method of claim 136, wherein said light-reflector is characterized by a predetermined stopband being sufficiently narrow so as to provide a high reflectivity of said fundamental transverse mode and a low reflectivity of high-order transverse modes.

138. The method of claim 132, wherein said highly reflecting coat and said light-reflector are each independently characterized by a predetermined stopband being sufficiently narrow so as to provide a high reflectivity of said fundamental transverse mode and a low reflectivity of high-order transverse modes.

139. The method of claim 135, wherein said non-linear optical crystal is characterized by a frequency conversion efficiency, and further wherein a temperature dependence of said stopband of said highly reflecting coat equals a temperature dependence of said frequency conversion efficiency.

140. The method of claim 137, wherein said non-linear optical crystal is characterized by a frequency conversion efficiency, and further wherein a temperature dependence of said stopband of said light-reflector equals a temperature dependence of said frequency conversion efficiency.

141. The method of claim 138, wherein a temperature dependence of said stopband of said highly reflecting coat equals a temperature dependence of said frequency conversion efficiency.

142. The method of claim 141, wherein a temperature dependence of said stopband of said light-reflector equals a temperature dependence of said frequency conversion efficiency.

143. The method of claim 114, further comprising providing a spectrally selective filter and positioning said spectrally selective filter so as to prevent light having said second frequency from impinging said light-emitting device.

144. The method of claim 143, wherein said spectrally selective filter is formed on said non-linear optical crystal on a side facing to said light-emitting device.

145. The method of claim 114, wherein said extended waveguide comprises at least two parts each having a different refractive index such that said extended waveguide is characterized by a variable refractive index.

146. The method of claim 145, wherein said at least two parts of said extended waveguide comprise a first part having an intermediate refractive index and a second part having a high refractive index, said first and said second part are designed and constructed such that said fundamental transverse mode is generated in said first part, leaks into said second part and exit through a front facet of said light-emitting device at a predetermined angle.

147. The method of claim 114, wherein at least a portion of said extended waveguide comprises a photonic bandgap crystal.

148. The method of claim 147, wherein said photonic bandgap crystal comprises a structure having a periodically modulated refractive index, said structure comprises a plurality of layers.

149. The method of claim 148, wherein said light-emitting device comprises at least one absorbing layer capable of absorbing light located within one layer of said photonic bandgap crystal.

150. The method of claim 148, wherein said light-emitting device comprises a plurality of absorbing layers such that each one of said plurality of absorbing layer is located within a different layer of said photonic band gap crystal.

151. The method of claim 147, wherein at least a portion of said extended waveguide comprises a defect being adjacent to a first side of said photonic bandgap crystal, said defect and said photonic bandgap crystal are selected such that said fundamental transverse mode is localized at said defect and all other modes are extended over said photonic band gap crystal.

152. The method of claim 151, wherein said defect comprises an active region having an n-side and a p-side, said active region being capable of emitting light when exposed to an injection current.

153. The method of claim 151, wherein a total thickness of said photonic band gap crystal and said defect is selected so as to allow said low beam divergence.

154. The method of claim 153, wherein said light-emitting device comprises an n-emitter, adjacent to a second side of said photonic bandgap crystal and a p-emitter being spaced from said photonic bandgap crystal by said defect and adjacent to said defect.

155. The method of claim 154, wherein said light-emitting device comprises a p-doped layered structure having a variable refractive index, said p-doped layered structure being between said p-emitter and said defect.

156. The method of claim 154, wherein said n-emitter is formed on a first side of a substrate, said substrate being a III-V semiconductor.

157. The method of claim 156, wherein said III-V semiconductor is selected from the group consisting of GaAs, InAs, InP and GaSb.

158. The method of claim 156, wherein said light-emitting device comprises an n-contact being in contact with said substrate and a p-contact being in contact with said p-emitter.

159. The method of claim 158, wherein said light-emitting device comprises a p-doped layered structure having a variable refractive index, said p-doped layered structure being between said p-emitter and said defect.

160. The method of claim 159, wherein said variable refractive index is selected to prevent extension of said fundamental transverse mode to said n-contact and/or said p-contact.

161. The method of claim 158, wherein said p-emitter comprises at least one p-doped layer being in contact with said extended waveguide and at least one p+-doped layer being in contact with said p-contact.

162. The method of claim 154, wherein said defect further comprises a first thin tunnel barrier layer for electrons, located on said n-side and sandwiched between a first pair of additional layers, and a second thin tunnel barrier layer for holes, located on said p-side and sandwiched between a second pair of additional layers.

163. The method of claim 162, wherein said first thin tunnel barrier layer is formed from a material selected from the group consisting of a weakly-doped n-layer and an undoped layer.

164. The method of claim 162, wherein said second thin tunnel barrier layer is formed from a material selected from the group consisting of a weakly-doped p-layer and an undoped layer.

165. The method of claim 162, wherein said defect further comprises a thick n-doped layer contiguous with one of said first pair of additional layers remote from said active region; and a thick p-doped layer contiguous with said second pair of additional layers remote from said active region.

166. The method of claim 162, wherein at least one of said first pair of additional layers is formed from a material selected from the group consisting of a weakly-doped n-layer and an undoped layer.

167. The method of claim 162, wherein at least one of said second pair of additional layers is formed from a material selected from the group consisting of a weakly-doped p-layer and an undoped layer.

168. The method of claim 114, further comprising providing a lens and positioning said lens in said external cavity between said light-emitting device and said non-linear optical crystal.

169. The method of claim 168, wherein said lens is designed and constructed to transform a weakly diverging beam of light into a parallel beam of light.

170. The method of claim 169, wherein said light-reflector is a flat light-reflector, capable of reflecting said parallel beam.

\* \* \* \* \*

UNITED STATES PATENT AND TRADEMARK OFFICE
CERTIFICATE OF CORRECTION

PATENT NO. : 6,928,099 B2
DATED : August 9, 2005
INVENTOR(S) : Nikolai Ledenstov et al.

It is certified that error appears in the above-identified patent and that said Letters Patent is hereby corrected as shown below:

Title page,
Item [63], Related U.S. Application Data, insert -- US Application No. 09/946,016 filed on September 4, 2001 --.

Signed and Sealed this

Twenty-second Day of November, 2005

JON W. DUDAS
*Director of the United States Patent and Trademark Office*